United States Patent
Huang et al.

(10) Patent No.: US 12,273,087 B2
(45) Date of Patent: Apr. 8, 2025

(54) MULTIPLEXING CIRCUIT, INTERFACE CIRCUIT SYSTEM, AND MOBILE TERMINAL

(71) Applicant: Honor Device Co., Ltd., Shenzhen (CN)

(72) Inventors: Ting Huang, Shenzhen (CN); Chen Zhu, Shenzhen (CN); Yupeng Qiu, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 542 days.

(21) Appl. No.: 17/772,239

(22) PCT Filed: Nov. 6, 2020

(86) PCT No.: PCT/CN2020/127178
§ 371 (c)(1),
(2) Date: Apr. 27, 2022

(87) PCT Pub. No.: WO2021/093683
PCT Pub. Date: May 20, 2021

(65) Prior Publication Data
US 2022/0376679 A1    Nov. 24, 2022

(30) Foreign Application Priority Data
Nov. 14, 2019   (CN) .......................... 201911115273.X

(51) Int. Cl.
H03H 11/34   (2006.01)
H02J 7/00    (2006.01)

(52) U.S. Cl.
CPC ............... H03H 11/34 (2013.01); H02J 7/00 (2013.01)

(58) Field of Classification Search
CPC .................................. H03H 11/34; H02J 7/00
See application file for complete search history.

(56) References Cited

U.S. PATENT DOCUMENTS 8,840,017 B2 * 9/2014 Chan ....................... H02J 1/102
                                                          235/382
8,995,391 B2   3/2015 Rydnell et al.
(Continued)

FOREIGN PATENT DOCUMENTS

CN   102096651 A   6/2011
CN   103997552 A   8/2014
(Continued)

Primary Examiner — Richard V Muralidar
(74) Attorney, Agent, or Firm — Fish & Richardson P.C.

(57) ABSTRACT

A multiplexing circuit, an interface circuit system, and a mobile terminal, to resolve a problem that a charging current significantly decreases when a headset is used during charging of the mobile terminal. In a multiplexing circuit, a first switch circuit transmits a right-channel audio signal on a right-channel transmission end to a first external transmission end; a second switch circuit transmits a left-channel audio signal on a left-channel transmission end to a second external transmission end; when a second on voltage is received, but a first on voltage is not received, an isolation circuit transmits the second on voltage to a third switch circuit; and when the first on voltage and the second on voltage are received, the isolation circuit pulls down the third switch circuit, and isolates a ground end from a second on voltage end.

15 Claims, 13 Drawing Sheets

(56) References Cited

U.S. PATENT DOCUMENTS

| | | | |
|---|---|---|---|
| 9,431,841 B2 * | 8/2016 | Inha | H02J 7/342 |
| 10,056,719 B1 | 8/2018 | Golko et al. | |
| 10,467,167 B2 | 11/2019 | Yakame | |
| 11,445,276 B2 | 9/2022 | Huang et al. | |
| 2013/0119935 A1 | 5/2013 | Sufrin-Disler et al. | |
| 2016/0364360 A1 | 12/2016 | Lim | |
| 2019/0317582 A1 | 10/2019 | Nayak et al. | |
| 2021/0109878 A1 | 4/2021 | Jiang | |
| 2021/0314697 A1 | 10/2021 | Huang | |
| 2021/0321177 A1 | 10/2021 | Huang et al. | |

FOREIGN PATENT DOCUMENTS

| | | |
|---|---|---|
| CN | 104035357 A | 9/2014 |
| CN | 104158251 A | 11/2014 |
| CN | 105071795 A | 11/2015 |
| CN | 107205189 A | 9/2017 |
| CN | 107546808 A | 1/2018 |
| CN | 108093329 A | 5/2018 |
| CN | 108268397 A | 7/2018 |
| CN | 108666826 A | 10/2018 |
| CN | 109491942 A | 3/2019 |
| CN | 208707885 U | 4/2019 |
| CN | 109862457 A | 6/2019 |
| CN | 111130596 A | 5/2020 |
| IN | 104639147 A | 5/2015 |
| JP | 2017107331 A | 6/2017 |
| RU | 2581845 C2 | 4/2016 |
| WO | 2008065659 A2 | 6/2008 |
| WO | 2009011621 A1 | 1/2009 |
| WO | 2009011624 A1 | 1/2009 |
| WO | 2018176901 A1 | 10/2018 |

* cited by examiner

MULTIPLEXING CIRCUIT, INTERFACE CIRCUIT SYSTEM, AND MOBILE TERMINAL This application is a National Stage of International Application No. PCT/CN2020/127178, filed Nov. 6, 2020, which claims priority to Chinese patent application no. 201911115273.x, filed Nov. 14, 2019, both of which are hereby incorporated by reference in their entireties.

TECHNICAL FIELD

This application relates to the field of electronic and communications technologies, and in particular, to a multiplexing circuit, an interface circuit system, and a mobile terminal.

BACKGROUND

As requirements for portable performance of electronic products gradually increase, interfaces that are on some mobile terminals such as mobile phones and that are used to be coupled to external devices need to have relatively high compatibility. When a data cable is connected to the interface, the mobile phone may be charged through the data cable and the interface. When an analog headset is connected to the interface, audio signals in the mobile phone may be transmitted to the headset. To charge the mobile phone while listening to music, both the data cable and the analog headset may be coupled to the interface of the mobile phone by using a one-to-two adapter. However, to ensure that the headset can be normally used, when both the headset and a charger are connected by using the one-to-two adapter, the mobile phone automatically identifies that the devices connected to the interface are mainly used to transmit audio data rather than charging. Therefore, compared with a case in which the mobile phone is charged by being connected to the charger independently, a charging current is greatly reduced when the mobile phone is connected to both the headset and the charger by using the one-to-two adapter. As a result, a charging speed significantly decreases.

SUMMARY

This application provides a multiplexing circuit, an interface circuit system, and a mobile terminal, to resolve a problem that a charging current significantly decreases when a headset function is used during charging of the mobile terminal, compared with a case in which the mobile terminal is charged independently.

To achieve the foregoing objective, the following technical solutions are used in this application.

A first aspect of the embodiments of this application provides a multiplexing circuit, including a first switch circuit, a second switch circuit, a third switch circuit, and an isolation circuit. In addition, the multiplexing circuit has a first external transmission end, a second external transmission end, a right-channel transmission end, a left-channel transmission end, a first internal transmission end, a second internal transmission end, a first on voltage end, a ground end, and a second on voltage end. The first switch circuit is separately coupled to the first external transmission end, the right-channel transmission end, and the first on voltage end, and the first switch circuit is configured to: receive a first on voltage output by the first on voltage end, and transmit, to the first external transmission end, a right-channel audio signal provided by the right-channel transmission end. The second switch circuit is separately coupled to the second external transmission end, the left-channel transmission end, and the first on voltage end, and the second switch circuit is configured to: receive the first on voltage, and transmit, to the second external transmission end, a left-channel audio signal provided by the left-channel transmission end. The isolation circuit is separately coupled to the third switch circuit, the first on voltage end, the ground end, and the second on voltage end, and the isolation circuit is configured to: when a second on voltage output by the second on voltage end is received, but the first on voltage output by the first on voltage end is not received, transmit the second on voltage to the third switch circuit. The isolation circuit is further configured to: when the first on voltage and the second on voltage are received, pull down the third switch circuit, and isolate the ground end from the second on voltage end. The third switch circuit is further separately coupled to the first external transmission end, the second external transmission end, the first internal transmission end, and the second internal transmission end, and the third switch circuit is configured to: when the second on voltage is received, couple the first external transmission end to the first internal transmission end, and couple the second external transmission end to the second internal transmission end. The third switch circuit is further configured to: under the pull-down effect of the isolation circuit, disconnect the first external transmission end from the first internal transmission end, and disconnect the second external transmission end from the second internal transmission end.

In this way, in one aspect, when an analog headset is used during charging of the mobile terminal having the interface circuit system provided in the embodiments of this application, the first on voltage end provides the first on voltage to the first switch circuit, the second switch circuit, and the isolation circuit simultaneously. In this case, both the first switch circuit and the second switch circuit are in a closed state, and the right-channel audio signal provided by the right-channel transmission end and the left-channel audio signal provided by the left-channel transmission end are respectively transmitted to the analog headset by using the first switch circuit and the second switch circuit. In addition, the second on voltage end provides the second on voltage to the isolation circuit, and the isolation circuit pulls down the third switch circuit under the effect of the first on voltage and the second on voltage, so that the third switch circuit is in an open state. Therefore, the first external transmission end can be disconnected from the first internal transmission end, and the second external transmission end can be disconnected from the second internal transmission end. In this case, an SoC and a pin D+ and a pin D− of an external interface are in a floating state. In this case, according to the BC1.2 charging protocol, the SoC may fail to detect a category of a charger coupled to the external interface, and therefore consider that the charger is a non-standard charger. In this way, the SoC may control the external device to provide a charging voltage such as 5 V and a charging current such as 1.2 A in a non-standard charging mode to a VBUS pin of the external interface. Therefore, when the analog headset is used during charging, a charging speed of the mobile terminal can be improved. In another aspect, the audio signals output by the right-channel transmission end and the left-channel output end are alternating current signals, which have a positive voltage and a negative voltage. In this case, when the analog headset is used during charging, the third switch circuit is in an open state under the pull-down effect of the isolation circuit, to disconnect the first external transmission end from the first internal transmission end, and disconnect the second external transmission end from the second internal transmission end. In this case, the negative voltage in the audio signal is not transmitted, by using the third switch circuit, to a charging conversion chip and the SoC that have a relatively weak negative voltage resistance capability, so that damage caused by the negative voltage to the charging conversion chip and the SoC can be avoided. In still another aspect, when the analog headset is used during charging, the third switch circuit is in an open state under the pull-down effect of the isolation circuit, and the SoC is disconnected from the pin D+ and the pin D− of the external interface. Therefore, the SoC does not clamp the negative voltage in the audio signal by using the pin D+ and the pin D−. In other words, the SoC absorbs the negative voltage in the audio signal, thereby avoiding impact on the audio signal.

Optionally, the isolation circuit includes an isolation transistor and a first resistor. A gate of the isolation transistor is coupled to the first on voltage end, a first electrode of the isolation transistor is coupled to the third switch circuit, and a second electrode of the isolation transistor is coupled to the ground end. A first end of the first resistor is coupled to the first electrode of the isolation transistor, and a second end of the first resistor is coupled to the second on voltage end. In this way, when the analog headset is used during charging of the mobile terminal, the isolation transistor may be turned on, to pull down the third switch circuit, so that the third switch circuit is in an open state. Therefore, the first external transmission end can be disconnected from the first internal transmission end, and the second external transmission end can be disconnected from the second internal transmission end. In this case, the pin D+ and the pin D− of the external interface are in a floating state, thereby increasing the charging speed. In addition, the first resistor may isolate the second voltage end from the third switch circuit, to prevent the ground end from pulling down the second voltage end, and avoid affecting the charging process.

Optionally, the third switch circuit includes a fourth transistor and a fourth transistor. A gate of the third transistor is coupled to the first electrode of the isolation transistor, a first electrode of the third transistor is coupled to the first internal transmission end, and a second electrode of the third transistor is coupled to the first external transmission end. A gate of the fourth transistor is coupled to the first electrode of the isolation transistor, a first electrode of the fourth transistor is coupled to the second internal transmission end, and a second electrode of the fourth transistor is coupled to the second external transmission end. In this case, when a user performs charging or data transmission, the third transistor is turned on, and a signal path is formed between the first external transmission end and the first internal transmission end. The fourth transistor is turned on, and a signal path is formed between the second external transmission end and the second internal transmission end.

Optionally, the third switch circuit is further coupled to the right-channel transmission end and the left-channel transmission end. The third switch circuit further includes a third capacitor and a fourth capacitor. A first end of the third capacitor is coupled to the right-channel transmission end, and a second end of the third capacitor is coupled to the gate of the third transistor. In this case, the right-channel audio signal on the right-channel transmission end is transmitted to the gate of the third transistor by using the third capacitor. In this case, when the right-channel audio signal transmitted to the first external transmission end is applied to the second electrode of the third transistor, a voltage difference between the gate and the second electrode of the third transistor is zero, and the third transistor is still in a cut-off state, to avoid forming a signal path between the first external transmission end and the first internal transmission end, so that a negative voltage in the audio-right-channel signal is transmitted to a circuit structure coupled to the first internal transmission end. In addition, a first end of the fourth capacitor is coupled to the left-channel transmission end, and a second end of the fourth capacitor is coupled to the gate of the fourth transistor. In this case, the left-channel audio signal on the left-channel transmission end is transmitted to the gate of the fourth transistor by using the fourth capacitor. In this case, when the left-channel audio signal transmitted to the second external transmission end is applied to the second electrode of the fourth transistor, a voltage difference between the gate and the second electrode of the fourth transistor is zero, and the fourth transistor is still in a cut-off state, to avoid forming a signal path between the second external transmission end and the second internal transmission end, so that a negative voltage in the left-channel audio signal is transmitted to a circuit structure coupled to the second internal transmission end.

Optionally, the isolation circuit further includes a second resistor and a third resistor. A first end of the second resistor is coupled to the gate of the third transistor, and a second end of the second resistor is coupled to the first electrode of the isolation transistor. In this way, the first electrode of the isolation transistor is isolated from the gate of the third transistor by using the second resistor, so that it can be avoided that the isolation transistor directly pulls the gate of the third transistor down to a voltage of the ground end, and that a voltage of the gate of the third transistor cannot change based on a change of the right-channel audio signal on the right-channel transmission end. In addition, a first end of the third resistor is coupled to the gate of the fourth transistor, and a second end of the third resistor is coupled to the first electrode of the isolation transistor. In this way, the first electrode of the isolation transistor is isolated from the gate of the fourth transistor by using the third resistor, so that it can be ensured that the isolation transistor directly pulls the gate of the fourth transistor down to the voltage of the ground end, and that a voltage of the gate of the fourth transistor cannot change based on a change of the left-channel audio signal on the left-channel transmission end.

Optionally, a resistance of the first resistor ranges from 20 kΩ to 60 kΩ. In this case, when the resistance of the first resistor is less than 20 kΩ, power consumption is affected, and an isolation effect of the first resistor is not obvious. As a result, the ground end easily pulls down an REGN end of the charging conversion chip, and normal charging of a battery of the mobile terminal by the charging conversion chip is affected. In addition, the second on voltage provided by the REGN end of the charging conversion chip can be transmitted to the gate of the third transistor only after passing through the first resistor and the second resistor, and can be transmitted to the gate of the fourth transistor only after passing through the first resistor and the third resistor. Therefore, when the resistance of the first resistor is greater than 60 kΩ, an impedance of the signal path is relatively large, and an on time of the transistor is affected. As a result, the transistor can be turned on only after a relatively long time, which may lead to a data communication failure. In this way, when the resistance of the first resistor may range from 20 kΩ to 60 kΩ, the on time of the transistor can be ensured while power consumption is not affected and a better isolation effect of the first resistor is ensured. Similarly, a resistance of the second resistor ranges from 20 kΩ to 60 kΩ, and a resistance of the third resistor ranges from 20 kΩ to 60 kΩ.

Optionally, the third switch circuit further includes a first magnetic bead and a second magnetic bead. A first end of the first magnetic bead is coupled to the first switch circuit, and a second end of the first magnetic bead is coupled to the second electrode of the third transistor. A signal transmitted on the signal path formed between the first external transmission end and the first internal transmission end is a high-frequency signal. In this case, the first magnetic bead is in a high-resistance state, so that the first electrode of the first transistor may be isolated from the second electrode of the third transistor, to prevent a parasitic capacitance of the first transistor from affecting a signal passing through the third transistor. In addition, when the first transistor is turned on and the third transistor is cut off, the signal passing through the first transistor is a low-frequency signal. In this case, the first magnetic bead is in a low-resistance state, so that the right-channel audio signal on the right-channel transmission end can be transmitted to the first external transmission end by using the first transistor and the first magnetic bead. In addition, a first end of the second magnetic bead is coupled to the second switch circuit, and a second end of the second magnetic bead is coupled to the second electrode of the fourth transistor. A technical effect of the second magnetic bead can be obtained in the same way, and details are not described herein again.

Optionally, the third switch circuit further includes a third magnetic bead and a fourth magnetic bead. A first end of the third magnetic bead is coupled to the first switch circuit, and a second end of the third magnetic bead is coupled to the gate of the third transistor. The third magnetic bead may isolate the second electrode of the first transistor from the gate of the third transistor, thereby further reducing impact of the parasitic capacitance of the first transistor on the signal transmitted on the signal path formed between the first external transmission end and the first internal transmission end. In addition, a first end of the fourth magnetic bead is coupled to the second switch circuit, and a second end of the fourth magnetic bead is coupled to the gate of the fourth transistor. A technical effect of the fourth magnetic bead can be obtained in the same way, and details are not described herein again.

Optionally, the first switch circuit includes a first transistor and a first constant-voltage control circuit. A gate of the first transistor is coupled to the first on voltage end, a first electrode of the first transistor is coupled to the first external transmission end, and a second electrode of the first transistor is coupled to the right-channel transmission end. After receiving the first on voltage provided by the first on voltage end, the gate of the first transistor is in an on state, so that the right-channel transmission end can transmit the right-channel audio signal in the mobile phone to the first external transmission end by using the first transistor. The first constant-voltage control circuit is coupled to the gate and the second electrode of the first transistor, and the first constant-voltage control circuit is configured to transmit the right-channel audio signal to the gate of the first transistor, so that a probability that an impedance of the first transistor changes can be reduced in the audio signal transmission process. In addition, the second switch circuit includes a second transistor and a second constant-voltage control circuit. A gate of the second transistor is coupled to the first on voltage end, a first electrode of the second transistor is coupled to the second external transmission end, and a second electrode of the second transistor is coupled to the left-channel transmission end. After receiving the first on voltage provided by the first on voltage end, the gate of the second transistor is in an on state, so that the left-channel transmission end can transmit the left-channel audio signal in the mobile phone to the second external transmission end by using the second transistor. The second constant-voltage control circuit is coupled to the gate and the second electrode of the second transistor, and the second constant-voltage control circuit is configured to transmit the left-channel audio signal to the gate of the second transistor. A technical effect of the second constant-voltage control circuit is the same as that described above, and details are not described herein again.

Optionally, the first constant-voltage control circuit includes a first capacitor. A first end of the first capacitor is coupled to the gate of the first transistor, and a second end of the first capacitor is coupled to the second electrode of the first transistor. The first capacitor has a characteristic of passing an alternating current and resisting a direct current, so that the right-channel audio signal on the right-channel transmission end can be transmitted to the gate of the first transistor by using the first capacitor. In addition, the first voltage of a direct current voltage cannot be transmitted to the right-channel transmission end by using the first capacitor. The second constant-voltage control circuit includes a second capacitor. A first end of the second capacitor is coupled to the gate of the second transistor, and a second end of the second capacitor is coupled to the second electrode of the second transistor. A technical effect of the second capacitor is the same as that described above, and details are not described herein again.

Optionally, the first switch circuit further includes a fourth resistor. A first end of the fourth resistor is coupled to the gate of the first transistor, and a second end of the fourth resistor is coupled to the first on voltage end. The fourth resistor can prevent an alternating current audio signal loaded to the gate of the first transistor. In other words, the right-channel audio signal is transmitted to a power supply coupled to the first on voltage end, thereby affecting other circuit structures coupled to the power supply. The second switch circuit further includes a fifth resistor. A first end of the fifth resistor is coupled to the gate of the second transistor, and a second end of the fifth resistor is coupled to the first on voltage end. A technical effect of the fifth resistor is the same as that described above, and details are not described herein again.

A second aspect of the embodiments of this application provides an interface circuit system. The interface circuit system includes an external interface configured to be coupled to an external device, a charging conversion chip, an audio processing chip, and the any multiplexing circuit described above. The external interface is a Type-C interface. The external interface includes a pin D+, a pin D−, and a VBUS pin. In addition, a first external transmission end of the multiplexing circuit is coupled to the pin D+, a second external transmission end of the multiplexing circuit is coupled to the pin D−, and a right-channel transmission end and a left-channel transmission end of the multiplexing circuit are separately coupled to the audio processing chip. The audio processing chip is configured to: provide a right-channel audio signal to the right-channel transmission end, and provide a left-channel audio signal to the left-channel transmission end. A second on voltage end of the multiplexing circuit is coupled to the VBUS pin. The charging conversion chip is separately coupled to the VBUS pin, and a first internal transmission end and a second internal transmission end of the multiplexing circuit. The charging conversion chip is configured to adjust, based on voltages of the first internal transmission end and the second internal transmission end, a charging voltage provided by the VBUS pin. The interface circuit system has a same technical effect as the multiplexing circuit provided in the foregoing embodiment, and details are not described herein again.

Optionally, the interface circuit system further includes a wireless charging circuit and a wireless isolation switch. The wireless charging circuit is coupled to the charging conversion chip, and the wireless charging circuit is configured to: receive a wireless charging signal, and provide a charging voltage to the charging conversion chip. The wireless isolation switch is coupled to the charging conversion chip and the VBUS pin, and the wireless isolation switch is configured to disconnect the charging conversion chip from the VBUS pin when the wireless charging circuit receives the wireless charging signal. In this way, an analog headset can be used while the mobile terminal is wirelessly charged.

Optionally, the interface circuit system further includes a low dropout regulator. An input end of the low dropout regulator is configured to receive the charging voltage provided by the VBUS pin, and an output end of the low dropout regulator is coupled to the second on voltage end. The low dropout regulator is configured to: perform voltage regulation on the charging voltage provided by the VBUS pin, and provide the charging voltage to the second on voltage end. In this way, when the voltage provided by the VBUS pin of the external interface changes based on a charging type, the low dropout regulator may provide a stable voltage to the second on voltage end.

Optionally, the interface circuit system further includes a system on chip. The system on chip is separately coupled to the first internal transmission end and the second internal transmission end of the multiplexing circuit. The system on chip is configured to identify, based on the voltages of the first internal transmission end and the second internal transmission end according to a charging protocol, the external device connected to the external interface, so that the mobile terminal can be charged in a non-standard charger mode when the first internal transmission end and the second internal transmission end are in a floating state.

A third aspect of the embodiments of this application provides a mobile terminal, including a battery and the any the interface circuit system described above. A first on voltage end of a multiplexing circuit in the interface circuit system is coupled to the battery. The battery is configured to provide a first on voltage to the first on voltage end. A charging conversion chip in the interface circuit system is coupled to the battery. The charging conversion chip is configured to: convert a charging voltage provided by a VBUS pin of an external interface in the interface circuit system, and provide the charging voltage to the battery. The mobile terminal has a same technical effect as the interface circuit system provided in the foregoing embodiment, and details are not described herein again.

BRIEF DESCRIPTION OF DRAWINGS

FIG. 8b is a schematic diagram of a control process of a first constant-voltage control circuit in FIG. 8a;

Numeral references:
10: interface circuit system; 100: multiplexing circuit; 101: first switch circuit; 102: second switch circuit; 103: third switch circuit; 104: isolation circuit; 200: external interface; 300: audio processing chip; 400: charging conversion chip; 500: SoC; 600: analog switching switch; 11: first constant-voltage control circuit; 12: second constant-voltage control circuit; 800: wireless charging circuit; 900: wireless isolation switch.

DETAILED DESCRIPTION OF THE EMBODIMENTS

The following describes the technical solutions in the embodiments of this application with reference to the accompanying drawings in the embodiments of this application. It is clear that the described embodiments are merely a part rather than all of the embodiments of this application.

The following terms "first" and "second" are merely intended for a purpose of descriptions, and shall not be understood as an indication or implication of relative importance or implicit indication of a quantity of indicated technical features. Therefore, a feature limited by "first" or "second" may explicitly or implicitly include one or more features. In the descriptions of this application, unless otherwise stated, "a plurality of" means two or more.

In addition, in this application, orientation terms such as "upper", "lower", "left", and "right" may be defined by, but are not limited to, orientations of components schematically placed in the accompanying drawings. It should be understood that these orientation terms may be relative concepts, are used for description and clarification, and may vary accordingly based on the changes in the orientations of the components in the accompanying drawings.

In this application, unless otherwise expressly specified and limited, the term "connection" should be understood in a broad sense. For example, the "connection" may be a fixed connection, a detachable connection, or may be integrated, or may be a direct connection or an indirect connection through an intermediate medium. In addition, the term "coupling" may be a manner of implementing an electrical connection for signal transmission.

An embodiment of this application provides a mobile terminal. The mobile terminal may be, for example, a product having a display interface, such as a mobile phone, a display, a tablet computer, or a vehicle-mounted device, an intelligent display wearable product, such as a smart watch or a smart band, or another electronic device that can be connected to a charger and a headset. The specific form of the mobile terminal is not specially limited in this embodiment of this application.

Figure 1:
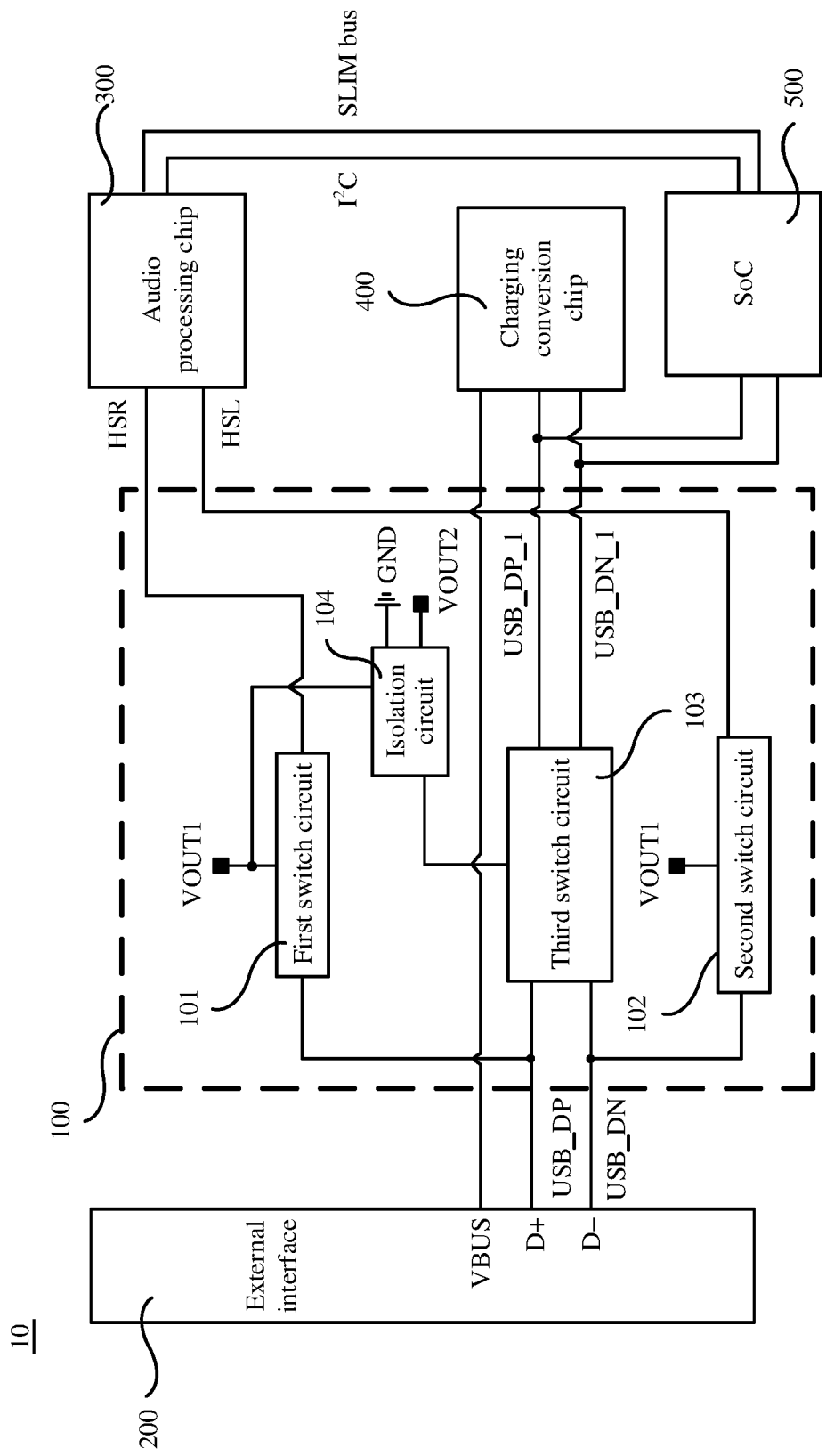
FIG. 1 is a schematic structural diagram of an interface circuit system according to some embodiments of this application.

To enable the mobile terminal to be coupled to an external device, such as a charger, an analog headset (with a 3.5 mm headset interface), a removable storage device, or a mobile terminal, the mobile terminal may include an interface circuit system 10 shown in FIG. 1. The interface circuit system 10 is configured to electrically connect an external device to an internal component of the mobile terminal. The interface circuit system 10 includes a multiplexing circuit 100 and an external interface 200.

The external interface 200 may be a Type-C interface. The external interface 200 may include a pin CC shown in FIG. 2. The type of the external device coupled to the Type-C interface may be identified by using the pin CC.

In some embodiments of this application, when the pin CC identifies that the external device is an analog headset, a signal path used to transmit audio in the multiplexing circuit 100 is closed, so that an audio signal inside the mobile terminal is transmitted to the external device, for example, the analog headset.

In this case, in the multiplexing circuit 100, the signal path used to transmit the audio signal may include a first switch circuit 101 and a second switch circuit 102 shown in FIG. 1. In addition, the multiplexing circuit 100 further includes a first external transmission end USB_DP, a second external transmission end USB_DN, a right-channel transmission end HSR, a left-channel transmission end HSL, a first on voltage end VOUT1, and a second on voltage end VOUT2.

Based on this, the interface circuit system 10 further includes an external interface 200 and an audio processing chip 300, for example, a codec (codec). The right-channel transmission end HSR and the left-channel transmission end HSL of the multiplexing circuit 100 may be coupled to the audio processing chip 300. The audio processing chip 300 is coupled to a system on chip (system on chip, SoC) 500 by using a serial low-power inter-chip media bus (the serial low-power inter-chip media bus, SLIM bus) and an inter-integrated circuit (inter-integrated circuit, I²C) bus.

When the external device connected to the external interface 200 is an analog headset, the analog headset is coupled to a pin D+ and a pin D− of the external interface 200. In this case, the audio processing chip 300 may decode an audio signal output by the SoC 500, provide a right-channel audio signal to the right-channel transmission end HSR, and provide a left-channel audio signal to the left-channel transmission end HSL, so that the analog headset can hear a sound made by the mobile terminal.

In this case, the first switch circuit 101 in the multiplexing circuit 100 is coupled to the first external transmission end USB_DP, the right-channel transmission end HSR, and the first on voltage end VOUT1. The first switch circuit 101 is configured to receive a first on voltage V1 output by the first on voltage end VOUT1, and is in a closed state under control of the first on voltage V1, to transmit the right-channel audio signal provided by the right-channel transmission end HSR to the first external transmission end USB_DP.

In addition, the second switch circuit 102 in the multiplexing circuit 100 is coupled to the second external transmission end USB_DN, the left-channel transmission end HSL, and the first on voltage end VOUT1. The second switch circuit 102 is configured to receive the first on voltage V1, and is in a closed state under control of the first on voltage V1, to transmit the left-channel audio signal provided by the left-channel transmission end HSL to the second external transmission end USB_DN.

Based on this, to transmit the right-channel audio signal through the first external transmission end USB_DP and the left-channel audio signal through the second external transmission end USB_DN to the analog headset as the external device, the analog headset may be inserted into the external interface 200 in the interface circuit system 10.

Figure 2:
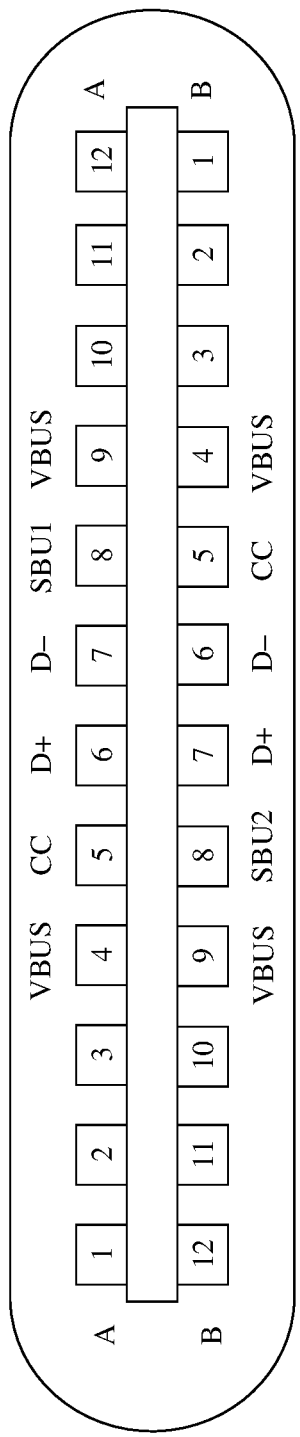
FIG. 2 is a schematic structural diagram of an external interface shown in FIG. 1.

For example, the external interface 200 may further include the pin D+ and the pin D− that are shown in FIG. 2 and that are specified based on a Type-C interface protocol. Based on this, the first external transmission end USB_DP of the multiplexing circuit 100 may be coupled to the pin D+, and the second external transmission end USB_DN may be coupled to the pin D−. In this way, after the analog headset is connected to the external interface 200, the analog headset may receive the right-channel audio signal transmitted by the first external transmission end USB_DP, and the left-channel audio signal transmitted by the second external transmission end USB_DN.

In addition, when the analog headset is coupled to the Type-C interface, a microphone (Microphone, MIC) on the analog headset is coupled to an SBU1 pin shown in FIG. 2 in the Type-C interface, a ground end on the analog headset is coupled to an SBU2 pin in the Type-C interface. A signal at an MIC end on the analog headset can be transmitted to the audio processing chip 300 shown in FIG. 3, and then transmitted to the SoC 500 after being encoded by the audio processing chip 300.

In addition, the SBU1 pin and the SBU2 pin in the Type-C interface are respectively located on side A and side B of the Type-C interface. In this case, when the headset is inserted into the Type-C interface in a forward insertion manner (electrically coupled to side A), the MIC end on the headset is coupled to the SBU1 pin, an analog ground end AGND is coupled to the SBU2 pin, and the signal at the MIC end can be normally input to the audio processing chip 300.

However, when the headset is inserted into the Type-C interface in a reverse insertion manner (electrically coupled to side B), the MIC end on the headset is coupled to the SBU2 pin, and the analog ground end AGND is coupled to the SBU1 pin, and the signal at the MIC end cannot be normally input to the audio processing chip 300. Therefore, the interface circuit system further includes an analog switching switch 600. The analog switching switch 600 may be used to switch a manner of coupling the SBU1 pin and the SBU2 pin to the headset, so that regardless of whether the headset is in a forward or reverse insertion manner, it can be ensured that the MIC end on the headset is coupled to the SBU1 pin, and the ground end is coupled to the SBU2 pin.

In some other embodiments of this application, when the pin CC identifies that the external device is a non-headset device such as a charger, a mobile phone, a computer, or a removable storage device, a signal path that is in the multiplexing circuit 100 and that is used to transmit a charging voltage or external data is closed, to transmit the charging voltage or external data to the inside of the mobile terminal.

Figure 3:
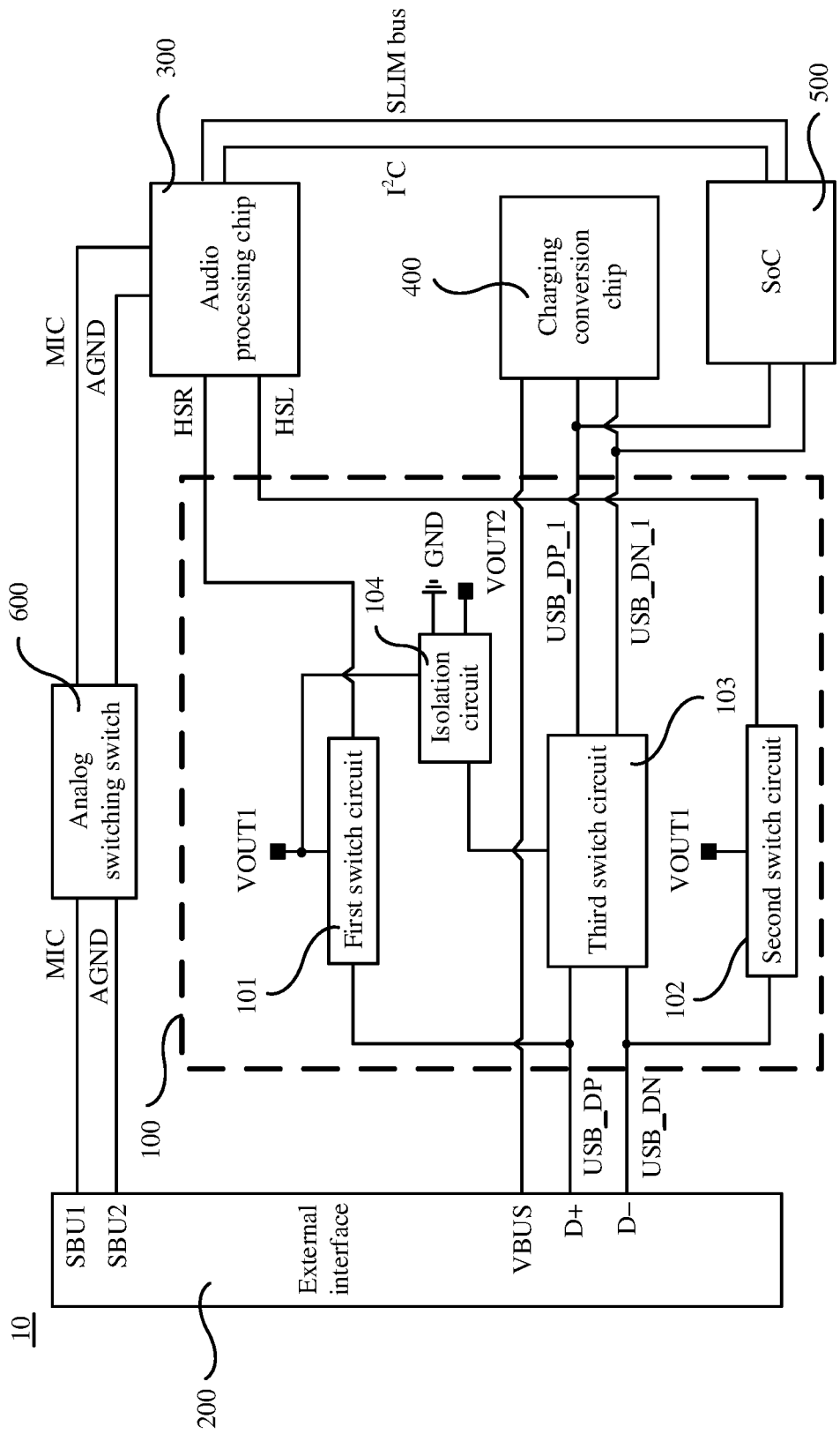
FIG. 3 is a schematic structural diagram of another interface circuit system according to some embodiments of this application.

In this case, in the multiplexing circuit 100, the signal path used to transmit the charging voltage or external data may include a third switch circuit 103 shown in FIG. 3. In addition, the multiplexing circuit 100 further includes a first internal transmission end USB_DP_1 and a second internal transmission end USB_DN_1.

The third switch circuit 103 is further coupled to the first external transmission end USB_DP, the second external transmission end USB_DN, the first internal transmission end USB_DP_1, and the second internal transmission end USB_DN_1. When the third switch circuit 103 is in a closed state, the first external transmission end USB_DP may be coupled to the first internal transmission end USB_DP_1, so that signal transmission can be implemented between the first external transmission end USB_DP and the first internal transmission end USB_DP_1. In addition, the second external transmission end USB_DN may be coupled to the second internal transmission end USB_DN_1, so that signal transmission can be implemented between the second external transmission end USB_DN and the second internal transmission end USB_DN_1.

Alternatively, when the third switch circuit 103 is in an open state, the first external transmission end USB_DP may be disconnected from the first internal transmission end USB_DP_1, so that signal transmission cannot be performed between the first external transmission end USB_DP and the first internal transmission end USB_DP_1. In addition, the second external transmission end USB_DN may be disconnected from the second internal transmission end USB_DN_1, so that signal transmission cannot be performed between the second external transmission end USB_DN and the second internal transmission end USB_DN_1.

It should be noted that, in some embodiments of this application, when the external device connected to the external interface 200 is a computer or a removable storage device (for example, a USB flash drive or a removable hard disk), when the third switch circuit 103 is in a closed state, signals transmitted by the first external transmission end USB_DP and the second external transmission end USB_DN to the first internal transmission end USB_DP_1 and the second internal transmission end USB_DN_1 respectively may be data signals provided by the external device. As shown in FIG. 3, when the interface circuit system 10 includes an SoC 500, the SoC 500 may be coupled to the first internal transmission end USB_DP_1 and the second internal transmission end USB_DN_1, so that a data signal provided by the external device can be transmitted to the SoC 500, to process the data signal by using the SoC 500.

Alternatively, in some other embodiments of this application, the interface circuit system 10 may further include a charging conversion chip 400 shown in FIG. 1, and the external interface 200 has a VBUS pin shown in FIG. 2. As shown in FIG. 1, the charging conversion chip 400 is coupled to the VBUS pin, the first internal transmission end USB_DP_1, and the second internal transmission end USB_DN_1.

In this case, when the external device connected to the external interface 200 is a charger, when the third switch circuit 103 is in a closed state, the charging conversion chip 400 may receive voltage signals transmitted by the first external transmission end USB_DP and the second external transmission end USB_DN to the first internal transmission end USB_DP_1 and the second internal transmission end USB_DN_1 respectively, and detect a charging type based on the voltages of the first internal transmission end USB_DP_1 and the second internal transmission end USB_DN_1, to control the charger to provide a charging voltage to the VBUS pin. In addition, the charging conversion chip 400 is further coupled to a battery inside the mobile terminal, so that a charging voltage of the VBUS pin can be converted by using the charging conversion chip 400, and provided to the battery, to perform fast charging (for example, a power supply voltage is 9 V, and a power supply current is 2 A) or slow charging (for example, a power supply voltage is 5 V and a power supply current is 1.2 A).

In addition, when the SoC 500 may be coupled to the first internal transmission end USB_DP_1 and the second internal transmission end USB_DN_1, the SoC 500 may receive voltages transmitted by the first external transmission end USB_DP and the second external transmission end USB_DN to the first internal transmission end USB_DP_1 and the second internal transmission end USB_DN_1 respectively, and detects, according to the BC1.2 charging protocol, whether the type of the external device connected to the external interface 200 is a charger or a personal computer (personal compute, PC).

It can be learned from the foregoing that when an analog headset is connected to the external interface 200, the first switch circuit 101 and the second switch circuit 102 in the multiplexing circuit 100 are in a closed state, so that the right-channel audio signal provided by the right-channel transmission end HSR and the left-channel audio signal provided by the left-channel transmission end HSL can be transmitted to the analog headset by using the first switch circuit 101 and the second switch circuit 102 respectively. In addition, when a charger is connected to the external interface 200, the third switch circuit 103 in the multiplexing circuit 100 is in a closed state, so that the charging conversion chip 400 can receive voltage signals transmitted by the first external transmission end USB_DP and the second external transmission end USB_DN to the first internal transmission end USB_DP_1 and the second internal transmission end USB_DN_1 respectively, to determine a charging type. Therefore, a charging voltage and a charging current that are provided by the VBUS pin of the external interface 200 are controlled.

Figure 4:
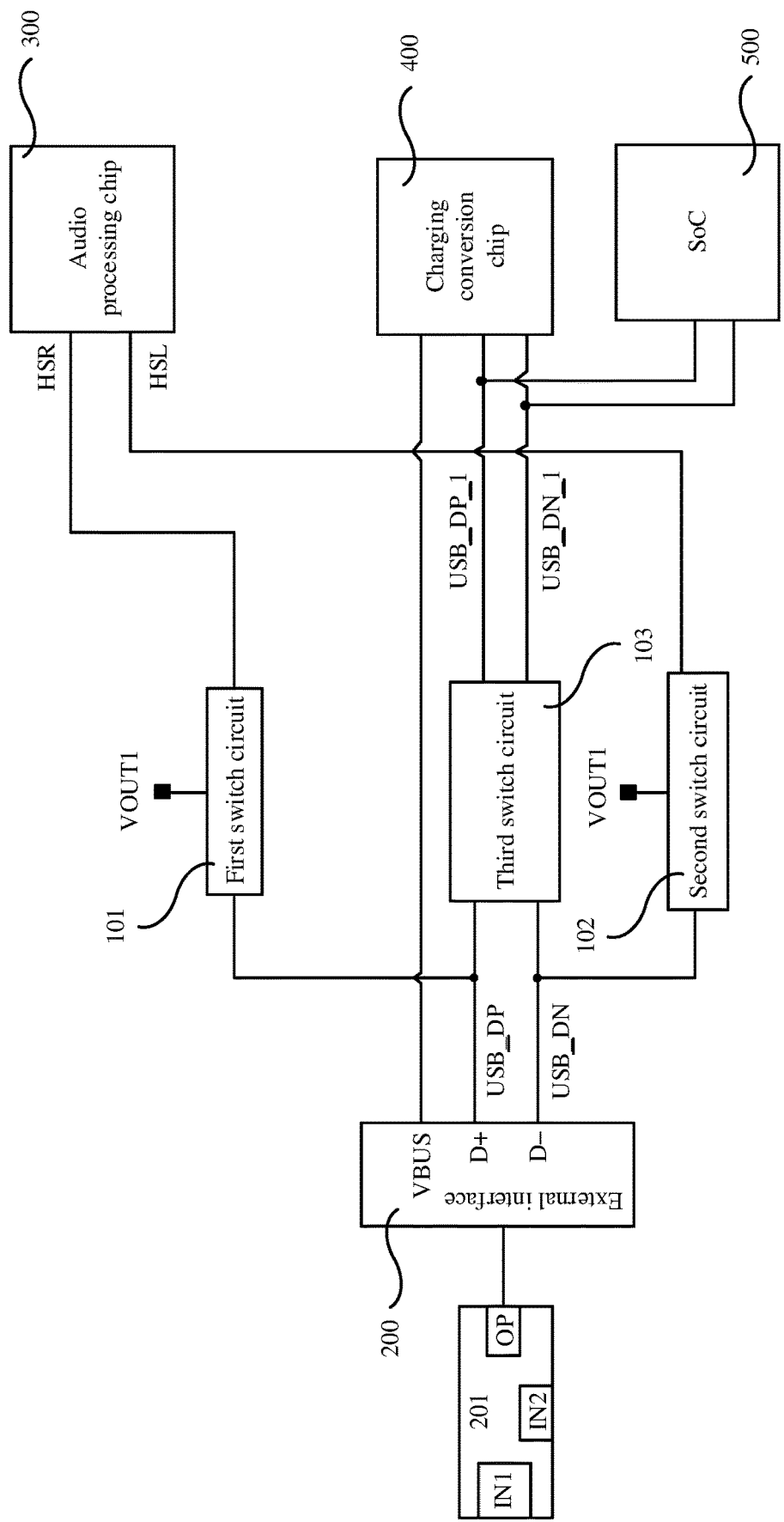
FIG. 4 is a schematic structural diagram of an interface circuit system in the related art.

To charge the mobile terminal while the analog headset is used, the external interface 200 may further be connected to a one-to-two adapter 201 shown in FIG. 4. The one-to-two adapter 201 has a first input interface IN1, a second input interface IN2, and an output interface OP. The first input interface IN1 is used to be coupled to the charger, the second input interface IN2 is used to be coupled to the analog headset, and the output interface OP is used to be coupled to the external interface 200. In this case, both the charger and the analog headset can be coupled to the external interface 200 by using the one-to-two adapter 201, so that the mobile terminal can be charged while the analog headset is used. Based on this, in the related art, the first switch circuit 101, the second switch circuit 102, and the third switch circuit 103 all need to be in a closed state. In this case, because the first switch circuit 101 and the second switch circuit 102 are closed, the pin D+ and the pin D− of the external interface 200 are coupled to the right-channel transmission end HSR and the left-channel output end HSL respectively. Based on this, because the third switch circuit 103 is also in a closed state, the SoC 500 may be coupled to the pin D+ and the pin D− of the external interface 200 by using the third switch circuit 103. In this case, because the audio processing chip 300 is in an output device and has a characteristic of low impedance, the SoC 500 can detect, according to the BC1.2 charging protocol, that the right-channel transmission end HSR and the left-channel output end HSL are independently pulled down. Therefore, it is considered that the external device connected to the external interface 200 is a PC. In this case, the SoC 500 considers that data transmission rather than charging is performed between the external device and the mobile terminal. In this case, the SoC 500 can control the external device to provide a very small charging current, for example, a 500 mA charging current, to the VBUS pin of the external interface 200. As a result, a problem of a slow charging speed is caused.

Figure 5:
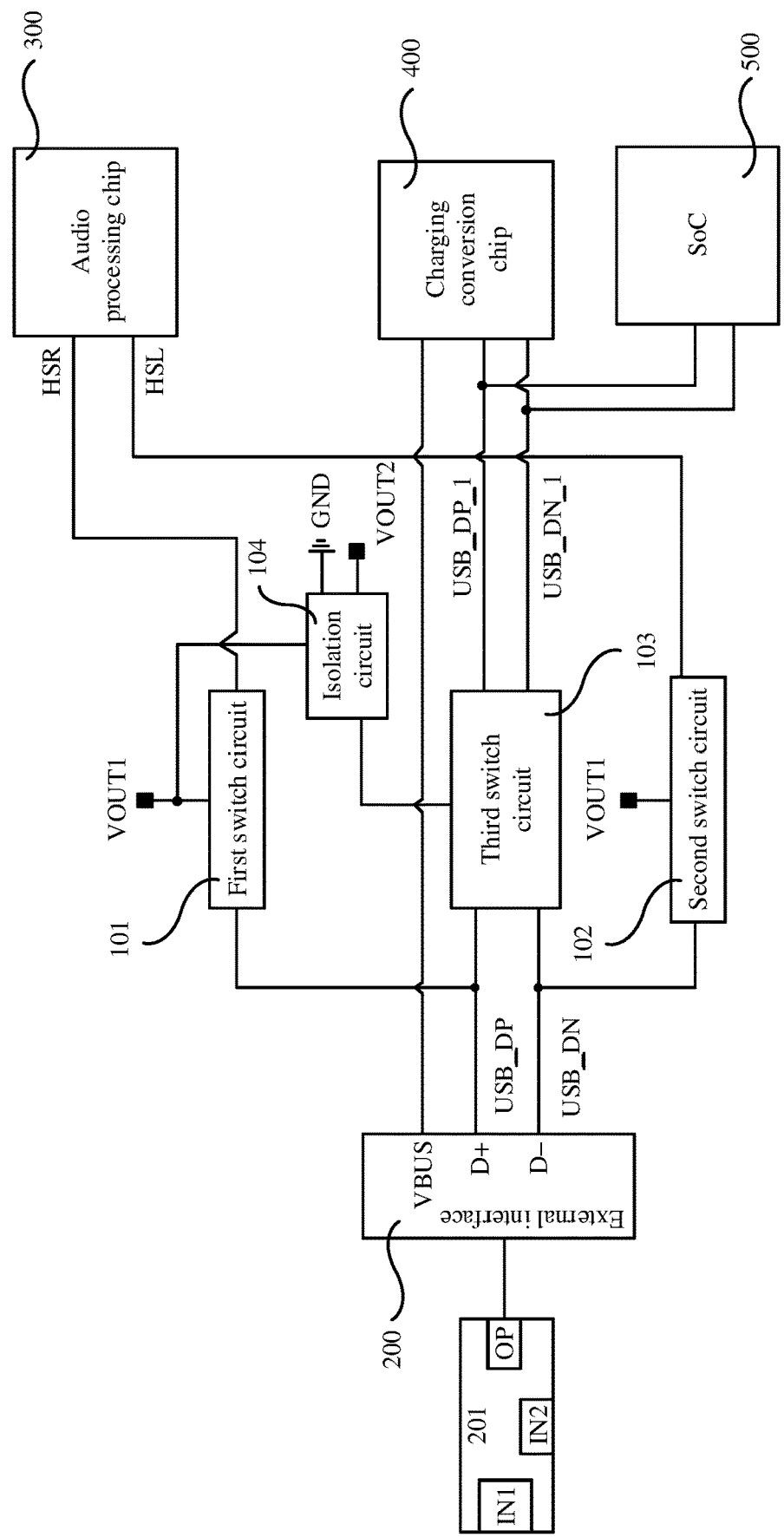
FIG. 5 is a schematic diagram of using an analog headset during charging in an interface circuit system according to some embodiments of this application.

To resolve the foregoing problem in this application, in some embodiments of this application, the multiplexing circuit 100 may further include an isolation circuit 104 shown in FIG. 1, FIG. 3, or FIG. 5. The isolation circuit 104 is coupled to the third switch circuit 103, the first on voltage end VOUT1, the ground end GND, and the second on voltage end VOUT2.

The isolation circuit 104 is configured to: when a second on voltage V2 output by the second on voltage end VOUT2 is received, but the first on voltage V1 output by the first on voltage end VOUT1 is not received, transmit the second on voltage V2 to the third switch circuit 103, so that the third switch circuit 103 that receives the second on voltage V2 is in a closed state. In this case, the third switch circuit 103 can enable signal transmission between the first external transmission end USB_DP and the first internal transmission end USB_DP_1, and enable signal transmission between the second external transmission end USB_DN and the second internal transmission end USB_DN_1.

In addition, the isolation circuit 104 is further configured to pull down the third switch circuit 103 when the first on voltage V1 output by the first on voltage end VOUT1 and the second on voltage V2 output by the second on voltage end VOUT2 are received, so that the third switch circuit 103 is in an open state. Therefore, the first external transmission end USB_DP can be disconnected from the first internal transmission end USB_DP_1, so that signal transmission cannot be performed between the first external transmission end USB_DP and the first internal transmission end USB_DP_1. In addition, the second external transmission end USB_DN may be disconnected from the second internal transmission end USB_DN_1, so that signal transmission cannot be performed between the second external transmission end USB_DN and the second internal transmission end USB_DN_1.

In this way, in one aspect, when an analog headset is used during charging of the mobile terminal having the interface circuit system 10 provided in this embodiment of this application, the first on voltage end VOUT1 provides the first on voltage V1 to the first switch circuit 101, the second switch circuit 102, and the isolation circuit 104. In this case, both the first switch circuit 101 and the second switch circuit 102 are in a closed state, and the right-channel audio signal provided by the right-channel transmission end HSR and the left-channel audio signal provided by the left-channel transmission end HSL are transmitted to the analog headset by using the first switch circuit 101 and the second switch circuit 102 respectively.

In addition, the second on voltage end VOUT2 provides the second on voltage V2 to the isolation circuit 104, and the isolation circuit 104 pulls down the third switch circuit 103 under the effect of the first on voltage V1 and the second on voltage V2, so that the third switch circuit 103 is in an open state. Therefore, the first external transmission end USB_DP can be disconnected from the first internal transmission end USB_DP_1, and the second external transmission end USB_DN can be disconnected from the second internal transmission end USB_DN_1.

In this case, the SoC 500 and the pin D+ and the pin D− of the external interface 200 are in a floating state. In this case, the SoC 500 may fail to detect, according to the BC1.2 charging protocol, a category of a charger coupled to the external interface 200. Therefore, it is considered that the charger is a non-standard charger. In this way, the SoC 500 can control the external device to provide a charging voltage (for example, 5 V) and a charging current (for example, 1.2 A, greater than 500 mA in a PC mode) in a non-standard charging mode to the VBUS pin of the external interface 200. Therefore, when the analog headset is used during charging, a charging speed of the mobile terminal is improved.

In another aspect, the audio signals output by the right-channel transmission end HSR and the left-channel output end HSL are alternating current signals, which have a positive voltage and a negative voltage. In this case, when the analog headset is used during charging, the third switch circuit 103 is in an open state under the pull-down effect of the isolation circuit 104, to disconnect the first external transmission end USB_DP from the first internal transmission end USB_DP_1, and disconnect the second external transmission end USB_DN from the second internal transmission end USB_DN_1. In this case, the negative voltage in the audio signal is not transmitted to the charging conversion chip 400 and the SoC 500 that have a relatively weak negative voltage resistance capability by using the third switch circuit 103, so that damage caused by the negative voltage to the charging conversion chip 400 and the SoC 500 can be avoided.

In still another aspect, when the analog headset is used during charging, the third switch circuit 103 is in an open state under the pull-down effect of the isolation circuit 104, and the SoC 500 is disconnected from the pin D+ and the pin D− of the external interface 200. Therefore, the SoC 500 does not clamp the negative voltage in the audio signal by using the pin D+ and the pin D−. In other words, the SoC 500 absorbs the negative voltage in the audio signal, thereby avoiding impact on the audio signal.

Figure 6A:
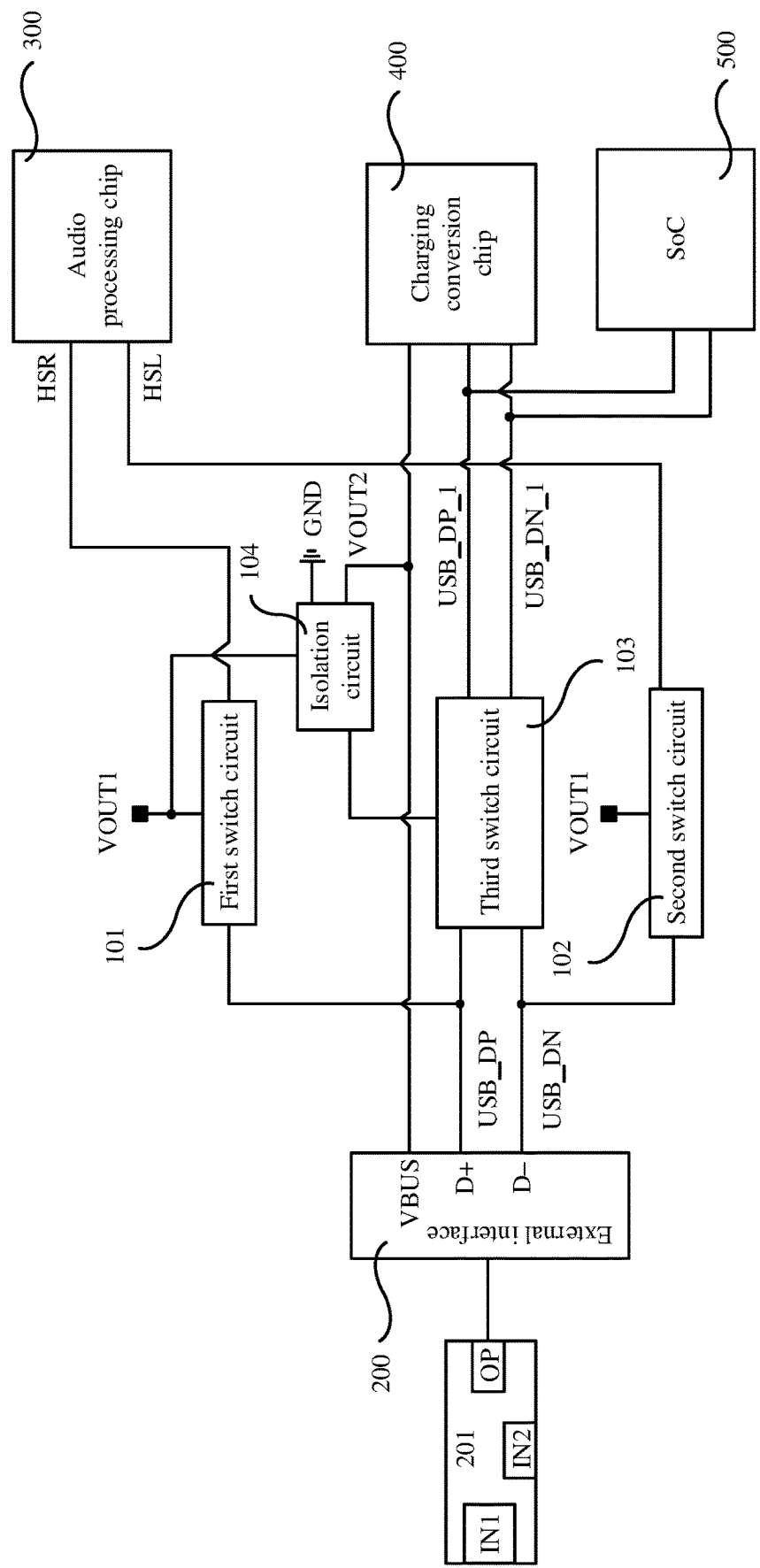
FIG. 6a is a schematic diagram of an arrangement manner of a second on voltage end in FIG. 5.

The following describes a manner of setting the second on voltage end VOUT2 by using an example. In some embodiments of this application, as shown in FIG. 6a, the second on voltage end VOUT2 may be coupled to the VBUS pin of the external interface 200. In this way, after the charger is connected to the external interface 200, the VBUS pin can provide a charging voltage to the second on voltage end VOUT2, so that the second on voltage end VOUT2 can provide the second on voltage V2 to the isolation circuit 104.

Figure 6B:
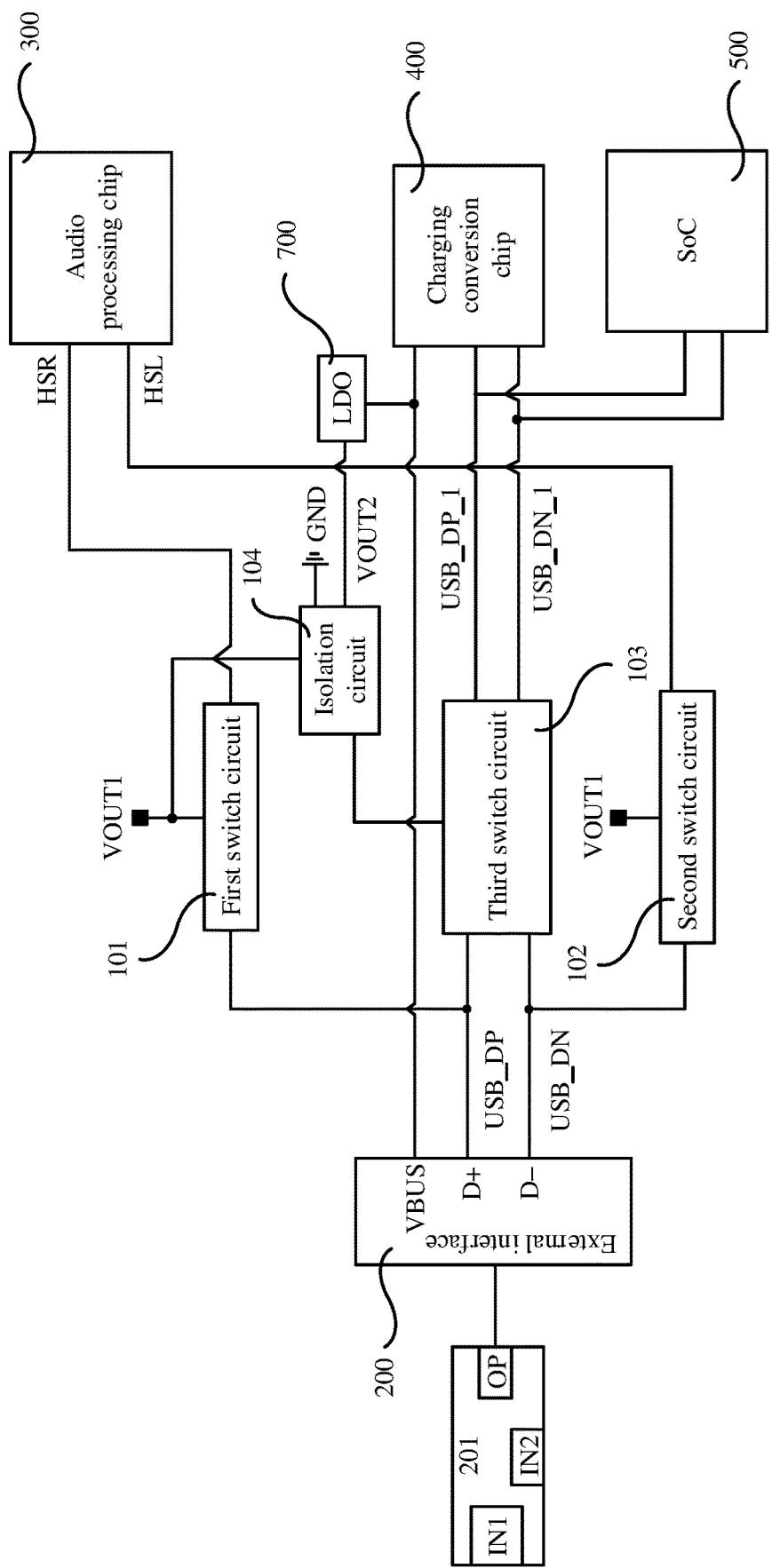
FIG. 6b is a schematic diagram of another arrangement manner of the second on voltage end in FIG. 5.

Alternatively, because the charger may perform fast charging and slow charging on the mobile terminal, the voltage provided by the VBUS pin of the external interface 200 may fluctuate relatively greatly and a relatively large surge problem may occur based on the change of the charging type. To ensure eye pattern quality produced by the production line of the external interface 200, in some other embodiments of this application, the interface circuit system 10 may further include a low dropout regulator (low dropout regulator, LDO) 700 shown in FIG. 6b.

An input end of the LDO 700 may be coupled to the VBUS pin of the external interface 200, to receive a charging voltage output by the VBUS pin. In addition, an output end of the LDO 700 is coupled to the second on voltage end VOUT2. The LDO 700 is configured to: perform voltage regulation on the charging voltage provided by the VBUS pin, and provide the charging voltage to the second on voltage end VOUT2. In this way, when the voltage provided by the VBUS pin of the external interface 200 changes based on the charging type, the LDO 700 may provide a stable voltage to the second on voltage end VOUT2.

Figure 6C:
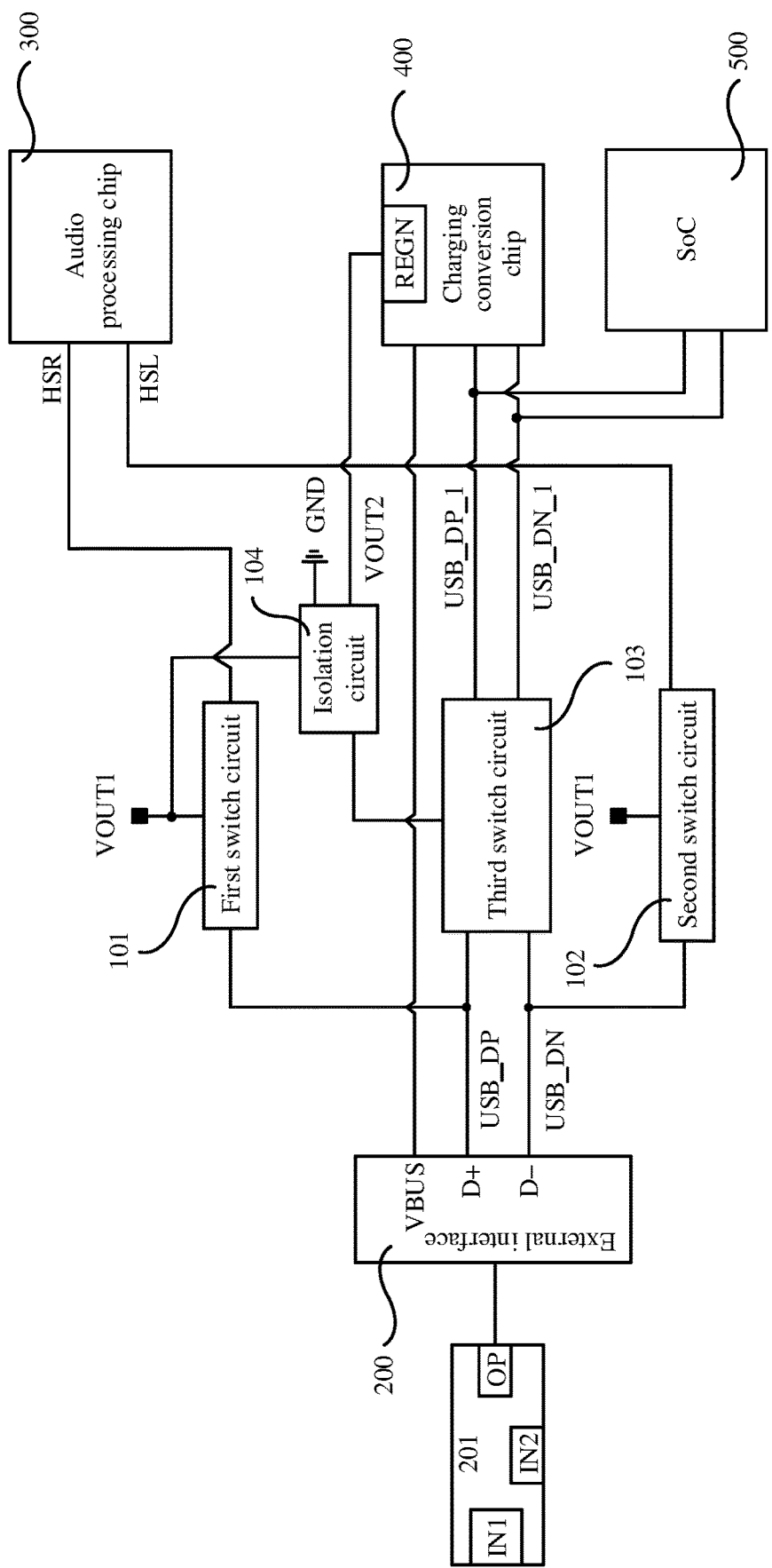
FIG. 6c is a schematic diagram of another arrangement manner of the second on voltage end in FIG. 5.

Alternatively, in some other embodiments of this application, the LDO 700 may be integrated into the charging conversion chip 400, and a voltage obtained after voltage regulation by the LDO 700 is provided to the second on voltage end VOUT2 by using an REGN pin shown in FIG. 6c in the charging conversion chip 400. In this way, after the charger is connected to the external interface 200, the VBUS pin may provide a charging voltage to the charging conversion chip 400. After converting the voltage, the charging conversion chip 400 may provide the voltage to the battery inside the mobile terminal, and may provide the voltage to the second on voltage end VOUT2 by using the REGN pin after the voltage regulation by the LDO 700, so that the second on voltage end VOUT2 can provide the second on voltage V2 to the isolation circuit 104.

It can be learned from the foregoing description that the second on voltage end VOUT2 may directly receive the voltage provided by the VBUS pin of the external interface 200, or receive the voltage obtained after the voltage of the VBUS pin is processed by the LDO 700. Therefore, there is a coupling between the second on voltage end VOUT2 and the VBUS pin, to implement electrical signal transmission. Based on this, when the isolation circuit 104 receives the first on voltage V1 output by the first on voltage end VOUT1 and the second on voltage V2 output by the second on voltage end VOUT2, and the isolation circuit 104 pulls down the third switch circuit 103, the isolation circuit 104 is further configured to isolate the ground end GND from the second on voltage end VOUT2, so that it can be ensured that the ground end DND pulls down the second on voltage end VOUT2, and that the voltage on the VBUS pin is pulled down, thereby avoiding affecting charging.

Figure 7:
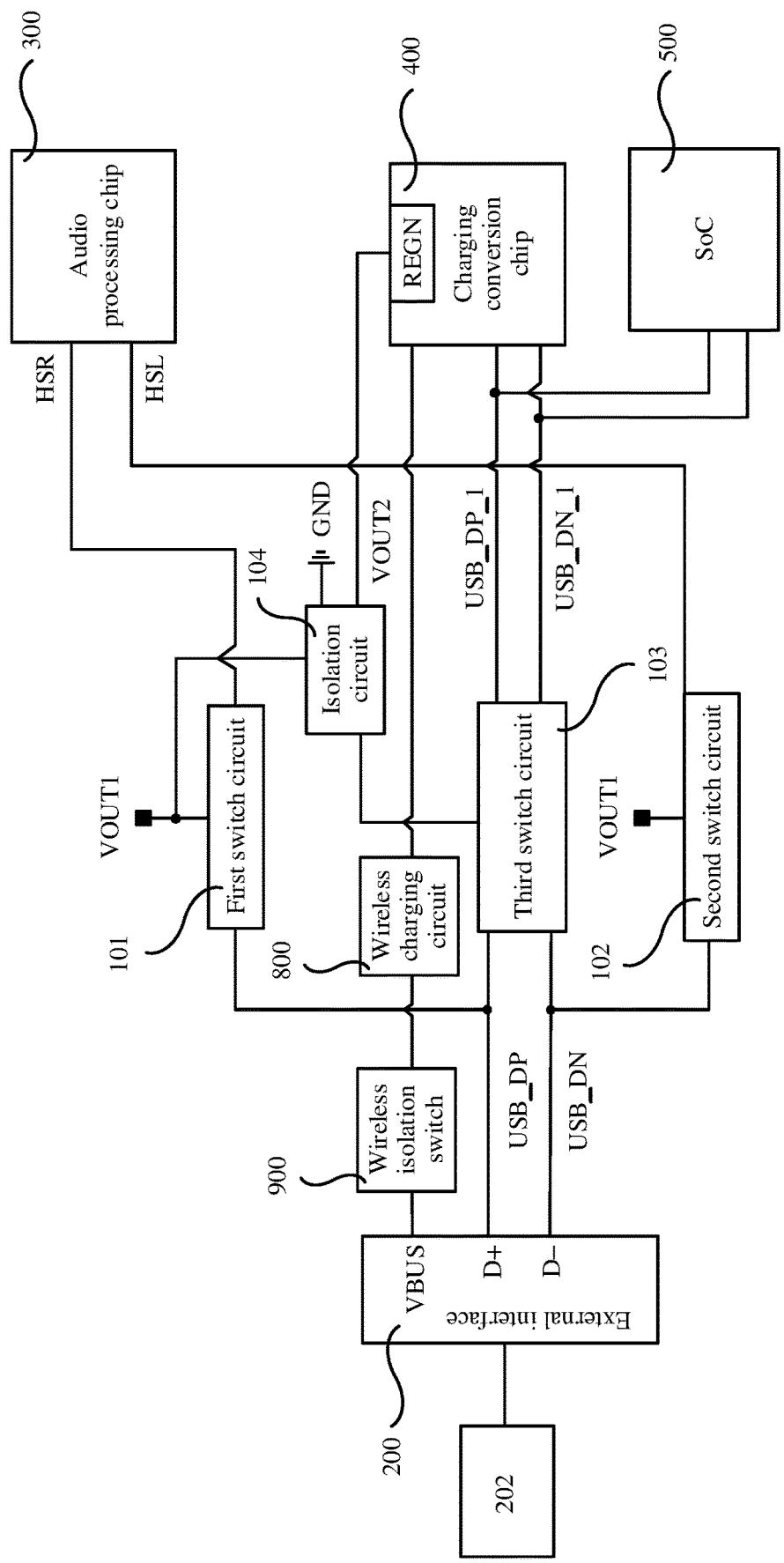
FIG. 7 is a schematic diagram of using an analog headset during charging in another interface circuit system according to some embodiments of this application.

In the foregoing solution, the external interface 200 is coupled to the one-to-two adapter 201, to implement using an analog headset during charging. In some other embodiments of this application, as shown in FIG. 7, when the external interface 200 is coupled to a headset adapter 202, using an analog headset during charging can be implemented by using a wireless charging solution.

Specifically, the interface circuit system 10 further includes a wireless charging circuit 800 and a wireless isolation switch 900. The wireless charging circuit 800 is coupled to the charging conversion chip 400. An antenna is disposed in the wireless charging circuit 800, and the antenna is configured to receive a wireless charging signal used by a wireless charging cradle (not shown in the figure). A component configured to generate a charging current based on electromagnetic induction is further disposed in the wireless charging circuit 800. The component may perform electromagnetic conversion and provide a charging voltage to the charging conversion chip 400 to implement wireless charging.

In addition, the wireless isolation switch 900 is coupled to the charging conversion chip 400 and the VBUS pin of the external interface 200. The wireless isolation switch 900 is configured to disconnect the charging conversion chip 400 from the VBUS pin when the antenna in the wireless charging circuit 800 receives the wireless charging signal. This prevents the voltage signal on the VBUS pin from affecting wireless charging.

Based on this, for the wireless charging solution, when an analog headset is used during charging, it can be learned from the foregoing that the third switch circuit 103 may be in an open state, so that the first external transmission end USB_DP may be disconnected from the first internal transmission end USB_DP_1, and the second external transmission end USB_DN may be disconnected from the second internal transmission end USB_DN_1. In this case, the SoC 500 and the pin D+ and the pin D− of the external interface 200 are in a floating state. The SoC 500 identifies that a wireless charging device is a non-standard charger, and provides a charging voltage in a non-standard charging mode, for example, 5 V and a charging current, for example, 1.2 A (greater than 500 mA in a PC mode) to the charging conversion chip 400 by using the wireless charging circuit 800, to improve a charging speed of the mobile terminal when an analog headset is used during charging.

In addition, when the third switch circuit 103 may be in an open state, the negative voltage in the audio signal is not transmitted to the charging conversion chip 400 and the SoC 500 that have a relatively weak negative voltage resistance capability by using the third switch circuit 103, so that damage caused by the negative voltage to the charging conversion chip 400 and the SoC 500 can be avoided. In addition, the SoC 500 is disconnected from the pin D+ and the pin D− of the external interface 200. Therefore, the SoC 500 does not clamp the negative voltage in the audio signal by using the pin D+ and the pin D−, to reduce a probability that quality of the audio signal deteriorates.

The following describes in detail specific structures of the first switch circuit 101, the second switch circuit 102, the third switch circuit 103, and the isolation circuit 104 in the multiplexing circuit 100 by using examples.

Figure 8A:
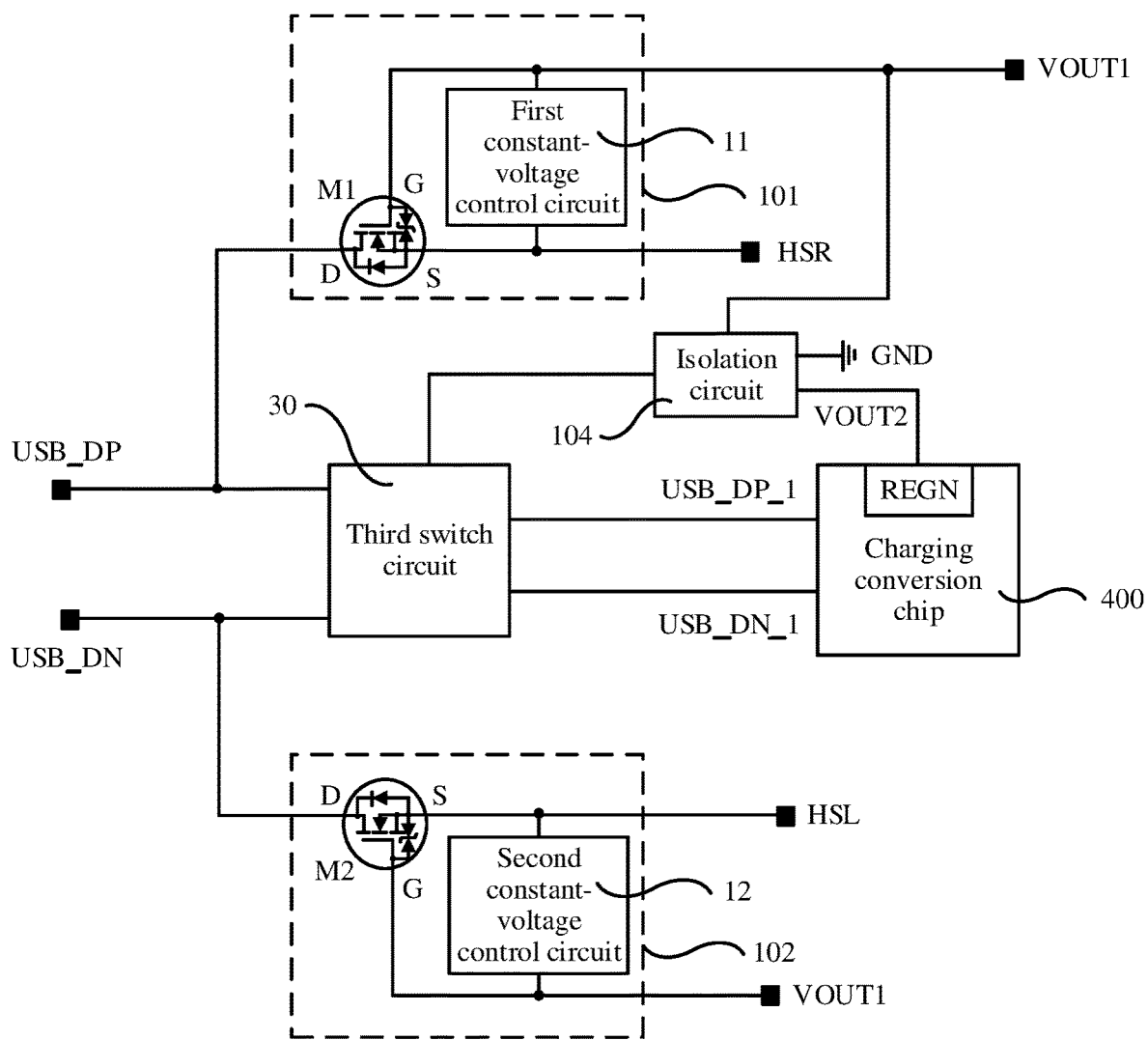
FIG. 8a is a specific schematic structural diagram of an interface circuit system according to some embodiments of this application.

As shown in FIG. 8a, the first switch circuit includes a first transistor M1. A gate (Gate, G) of the first transistor M1 is coupled to the first on voltage end VOUT1, and may receive the first on voltage V1 provided by the first on voltage end VOUT1. A first electrode (for example, a drain (drain, D)) of the first transistor M1 is coupled to the first external transmission end USB_DP, and a second electrode (for example, a source (source, D)) of the first transistor M1 is coupled to the right-channel transmission end HSR.

In this case, after receiving the first on voltage V1 provided by the first on voltage end VOUT1, the gate G of the first transistor M1 is in an on state, so that the right-channel transmission end HSR can transmit the right-channel audio signal in the mobile phone to the first external transmission end USB_DP by using the first transistor M1.

Based on this, because the audio signal is an alternating current signal, the audio signal fluctuates. In other words, a voltage loaded to the second electrode (for example, the source S) of the first transistor M1 fluctuates. The first on voltage V1 that is used to control the first transistor M1 to be turned on and that is provided by the first on voltage end VOUT1 is a direct current voltage, for example, 3 V. In this way, a voltage difference Vgs between the gate G and the second electrode (for example, the source S) of the first transistor M1 changes as the right-channel audio signal fluctuates, so that an impedance of the first transistor M1 changes, which further affects a total harmonic distortion-noise (Total Harmonic Distortion-Noise, THD-N) indicator of the audio.

To resolve the foregoing problem, as shown in FIG. 8a, the first switch circuit 101 further includes a first constant-voltage control circuit 11.

Figure 8B:
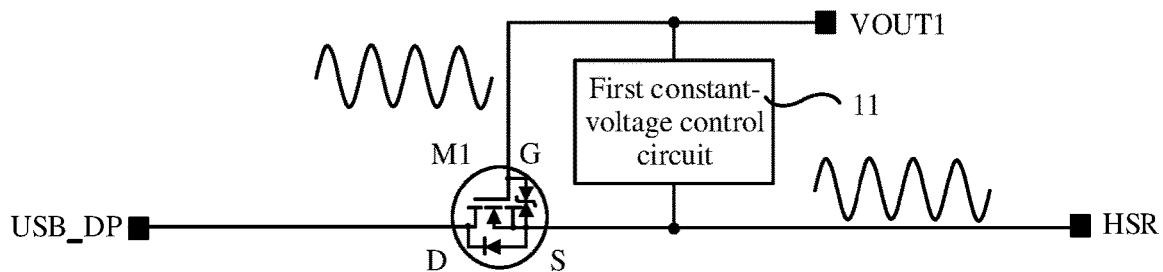

The first constant-voltage control circuit 11 is coupled to the gate G and the second electrode (for example, the source S) of the first transistor M1. As shown in FIG. 8b, the first constant-voltage control circuit 11 is configured to load the right-channel audio signal (represented by a sine wave in the figure) to the gate G of the first transistor M1. In this case, the gate G of the first transistor M1 also has the right-channel audio signal that fluctuates. In this way, a voltage difference (Vgs=V1=3 V) between the gate G and the second electrode (for example, the source S) of the first transistor M1 is a constant direct current voltage, so that a probability that the impedance of the first transistor M1 changes can be reduced in an audio signal transmission process, and the THD-N indicator can be improved.

Figure 8C:
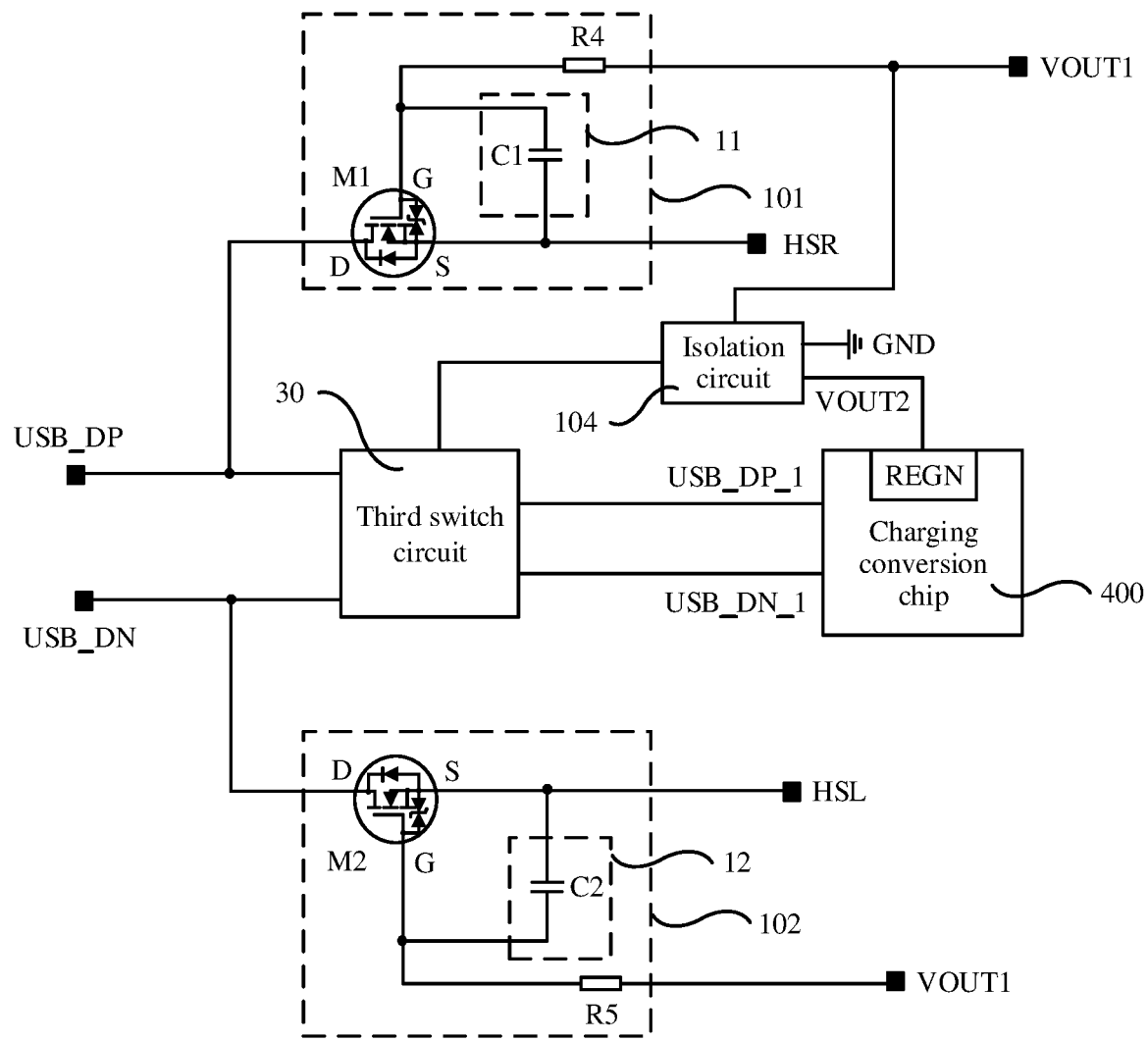
FIG. 8c is another specific schematic structural diagram of an interface circuit system according to some embodiments of this application.

In some embodiments of this application, the first constant-voltage control circuit 11 may include a first capacitor C1 shown in FIG. 8c. One end of the first capacitor C1 is coupled to the gate G of the first transistor M1, and the other end is coupled to the second electrode (for example, the source S) of the first transistor M2. In this case, by using the characteristic of passing an alternating current and resisting a direct current of the first capacitor C1, an alternating current signal on the right-channel transmission end HSR, namely, the right-channel audio signal, may be transmitted to the gate G of the first transistor M1 by using the first capacitor C1, so that a voltage difference Vgs between the gate G and the second electrode (for example, the source S) of the first transistor M1 is equal to V1. In addition, the first on voltage V1 of the direct current voltage cannot be transmitted to the right-channel transmission end HSR by using the first capacitor C1.

Similarly, the second switch circuit includes a second transistor M2 shown in FIG. 8a. A gate G of the second transistor M2 is coupled to the first on voltage end VOUT1, and may receive the first on voltage V1 provided by the first on voltage end VOUT1. A first electrode (for example, a drain D) of the second transistor M2 is coupled to the second external transmission end USB_DN, and a second electrode (for example, a source S) of the second transistor M2 is coupled to the left-channel transmission end HSL.

In this case, after receiving the first on voltage V1 provided by the first on voltage end VOUT1, the gate G of the second transistor M2 is in an on state, so that the left-channel transmission end HSL can transmit the left-channel audio signal in the mobile phone to the second external transmission end USB_DN by using the second transistor M2.

In addition, the second constant-voltage control circuit 12 is coupled to the gate G and the second electrode (for example, the source S) of the second transistor M2, and the second constant-voltage control circuit 12 is configured to transmit the left-channel audio signal HSL to the gate G of the second transistor M2. Similarly, it can be learned that, in some embodiments of this application, the second constant-voltage control circuit 12 may include a second capacitor C2 shown in FIG. 8c.

One end of the second capacitor C2 is coupled to the gate G of the second transistor M2, and the other end is coupled to the second electrode (for example, source S) of the second transistor M2. In this case, by using the characteristic of passing an alternating current and resisting a direct current of the second capacitor C2, the left-channel audio signal on the left-channel transmission end HSL may be transmitted to the gate G of the second transistor M2 by using the second capacitor C2, so that a voltage difference Vgs between the gate G and the second electrode (for example, the source S) of the second transistor M2 is equal to V1. In addition, the first voltage V2 of the direct current voltage cannot be transmitted to the left-channel transmission end HSL by using the second capacitor C2.

In some embodiments of this application, capacitances of the first capacitor C1 and the second capacitor C2 may range from 4 μF to 10 μF. When a resistance of the capacitor is less than 4 μF, because the capacitance is relatively small, a blocking effect on the direct current voltage is relatively poor. As a result, an audio signal on the right-channel transmission end HSR or the left-channel transmission end HSL has relatively large noise. When the resistance of the capacitor is greater than 10 μF, the capacitor has a good characteristic of passing an alternating current and resisting a direct current. However, the capacitor has a relatively large size, and occupies relatively large wiring space on the mobile phone.

In addition, in some other embodiments of this application, the first constant-voltage control circuit 11 may further include an inductor connected in parallel to the first capacitor C1. Similarly, the second constant-voltage control circuit 12 may also include an inductor connected in parallel to the second capacitor C2. The noise on the gate G of the first transistor M1 and the second transistor M2 can be reduced by using a filtering effect of the inductor.

It should be noted that in this embodiment of this application, the first transistor M1 and the second transistor M2 may be a metal oxide semiconductor (Metal Oxide Semiconductor, MOS) field-effect transistor, a thin film transistor (Thin Film Transistor, TFT), or a triode. This is not limited in this application.

In this embodiment of this application, the first electrode of the transistor may be a source, and the second electrode is a drain, or the first electrode is a drain, and the second electrode is a source. For ease of description, in the following embodiments of this application, an example in which the transistor is an NMOS transistor (N-channel MOS transistor), the first electrode is a drain, and the second electrode is a source is used for description.

In addition, a direct current power supply, for example, a battery of the mobile phone, may be disposed in the mobile phone, and is configured to provide the first on voltage V1 that can control the first transistor M1 and the second transistor M2 to be turned on to the first on voltage end VOUT1. For example, the first transistor M1 and the second transistor M2 are N-channel transistors. When a pin CC in a Type-C interface of the mobile phone identifies that an external device coupled to the Type-C interface is an analog headset, the first transistor M1 and the second transistor M2 need to be turned on, to enable the first switch circuit 101 and the second switch circuit 102 respectively. In this case, a chip having a control function in the mobile phone, for example, the SoC 500, may be separately coupled to the Type-C interface and the battery, so that when the pin CC in the Type-C interface identifies that an external device coupled to the Type-C interface is an analog headset, the SoC 500 can control a first on voltage V1 provided by the battery to the first on voltage end VOUT1 to be a high level. In some embodiments of this application, to enable the battery to provide a stable first on voltage V1 to the first on voltage end VOUT1, an LDO may be disposed between the battery and the first on voltage end VOUT1, to provide the stable first on voltage V1 to the first on voltage end VOUT1 through a voltage regulation effect of the LDO.

In addition, the first switch circuit 101 further includes a fourth resistor R4 shown in FIG. 8c. A first end of the fourth resistor R4 is coupled to the gate G of the first transistor M1, and a second end is coupled to the first on voltage end VOUT1. In this case, the fourth resistor R4 can prevent an alternating current audio signal loaded to the gate of the first transistor M1, namely, the right-channel audio signal, from being transmitted to a power supply coupled to the first on voltage end VOUT1, thereby avoiding affecting other circuit structures coupled to the power supply.

Similarly, as shown in FIG. 8c, the second switch circuit 102 further includes a fifth resistor R4. A first end of the fifth resistor R4 is coupled to the gate G of the second transistor M2, and a second end is coupled to the first on voltage end VOUT1. A technical effect of the fifth resistor R4 is the same as that of the fourth resistor R4, and details are not described herein again.

Figure 9A:
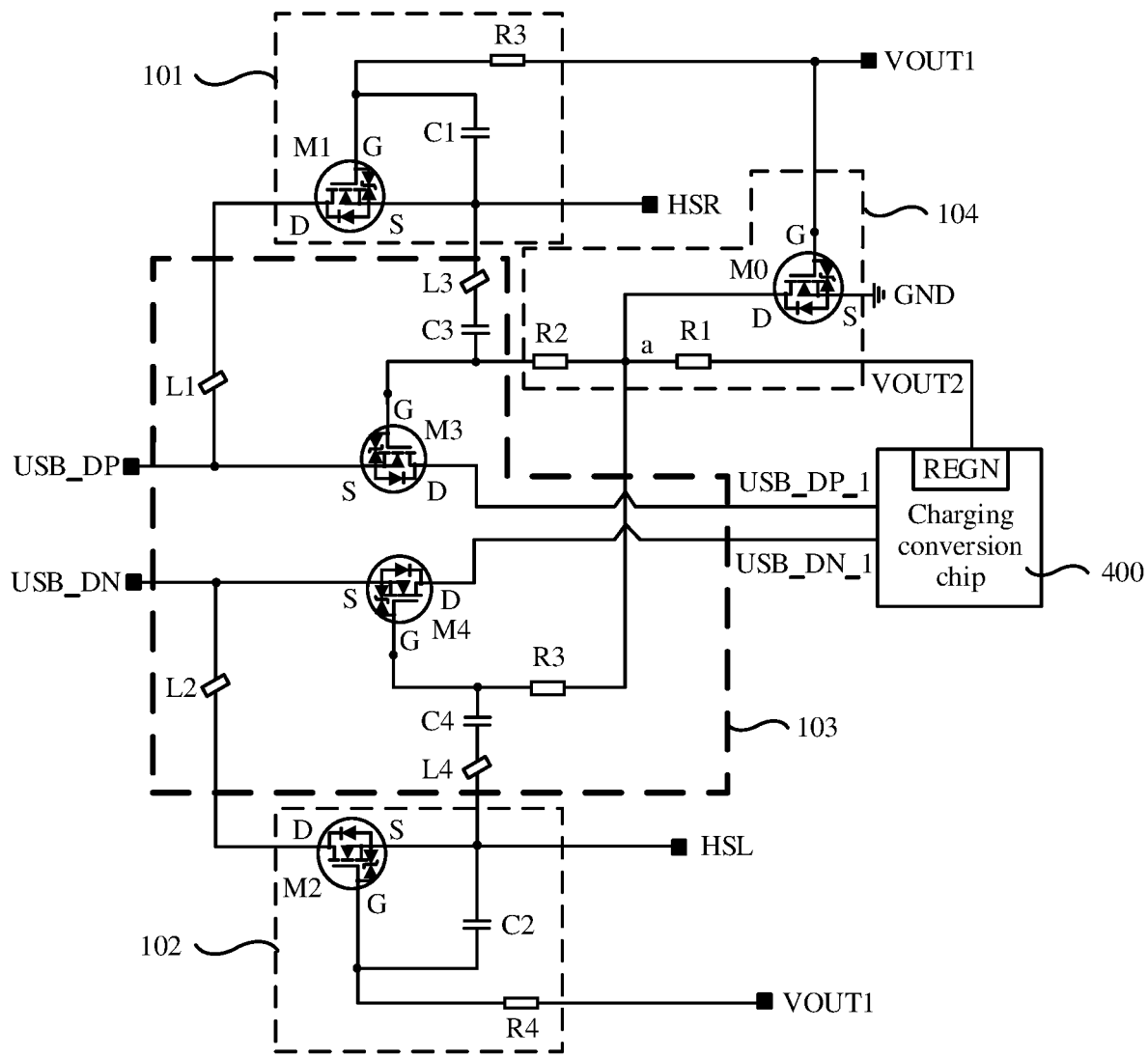
FIG. 9a is another specific schematic structural diagram of an interface circuit system according to some embodiments of this application.

In addition, as shown in FIG. 9a, the isolation circuit 104 includes an isolation transistor M0. A gate G of the isolation transistor M0 is coupled to the first on voltage end VOUT1, to receive the first on voltage V1 provided by the first on voltage end VOUT1. A first electrode, for example, a drain D, of the isolation transistor M0 is coupled to the third switch circuit 103, and a second electrode, for example, a source S, of the isolation transistor M0 is coupled to the ground end GND.

When the third switch circuit 103 includes a third transistor M3 and a fourth transistor M4, a gate G of the third transistor M3 is coupled to the first electrode, for example, the drain D, of the isolation transistor M0. A first electrode, for example, a drain D, of the third transistor M3 is coupled to the first internal transmission end USB_DP_1, and a second electrode, for example, a source S, of the third transistor M3 is coupled to the first external transmission end USB_DP. A gate of the fourth transistor M4 is coupled to the first electrode, for example, the drain D, of the isolation transistor M0. A first electrode, for example, a drain D, of the fourth transistor M4 is coupled to the second internal transmission end USB_DN_1, and a second electrode, for example, a source S, of the fourth transistor M4 is coupled to the second external transmission end USB_DN.

In addition, the isolation circuit 104 further includes a first resistor R1, a second resistor R2, and a third resistor R3. A first end of the first resistor R1 is coupled to the second electrode, for example, the source S, of the isolation transistor M0, and a second end of the first resistor R1 is coupled to the second on voltage end VOUT2.

A first end of the second resistor R2 is coupled to the gate G of the third transistor M3, and a second end of the second resistor R2 is coupled to the first electrode, for example, the drain D, of the isolation transistor M0, so that the first electrode, for example, the drain D, of the isolation transistor M0 is coupled to the gate G of the third transistor M3 by using the second resistor R2.

A first end of the third resistor R3 is coupled to the gate G of the fourth transistor M4, and a second end of the third resistor R3 is coupled to the first electrode, for example, the drain D, of the isolation transistor M0, so that the first electrode, for example, the drain D, of the isolation transistor M0 is coupled to the gate G of the fourth transistor M4 by using the third resistor R3.

The following describes in detail a specific operating process of the interface circuit system shown in FIG. 9a.

In some embodiments of this application, when a user uses an analog headset independently, when the analog headset is connected to the mobile terminal, for example, a mobile phone, by using an external interface 200 (for example, a Type-C interface), the pin CC in the Type-C interface of the mobile phone identifies that an external device coupled to the Type-C interface is the analog headset. In this case, the first on voltage end VOUT1 provides the first on voltage V1 to the gate G of the first transistor M1, the gate G of the second transistor M2, and the gate G of the isolation transistor M0, to turn on the first transistor M1, the second transistor M2, and the isolation transistor M0.

In this case, the right-channel transmission end HSR transmits the right-channel audio signal in the mobile phone to the first external transmission end USB_DP by using the first transistor M1. The left-channel transmission end HSL transmits the left-channel audio signal in the mobile phone to the second external transmission end USB_DN by using the second transistor M2, so that the analog headset can hear the audio signal sent by the mobile phone.

In addition, because the mobile phone is not charged, the REGN of the charging conversion chip 400 does not serve as the second on voltage end VOUT2 to provide the second on voltage V2 to the gate G of the third transistor M3 and the gate G of the fourth transistor M4. Therefore, the third transistor M3 and the fourth transistor M4 are in a cut-off state.

It can be learned from the foregoing that, when the mobile phone is coupled to the analog headset by using the Type-C interface, the third transistor M3 and the fourth transistor M4 may be cut off, and the first transistor M1 and the second transistor M2 are turned on. In this case, the negative voltage of the right-channel audio signal transmitted to the first external transmission end USB_DP through the right-channel transmission end HSR and the negative voltage of the left-channel audio signal transmitted to the second external transmission end USB_DN through the left-channel transmission end HSL are respectively applied to the second electrodes (for example, the source S) of the third transistor M3 and the fourth transistor M4, which causes a voltage difference between the gate G and the second electrode (for example, the source S) of the third transistor M3 and a voltage difference between the gate G and the second electrode (for example, the source S) of the fourth transistor M4. Therefore, the third transistor M3 and the fourth transistor M4 that are originally cut off are turned on. As a result, the negative voltages in the right-channel audio signal and the left-channel audio signal are respectively output to the first internal transmission end USB_DP_1 and the second internal transmission end USB_DP_1 by using the third transistor M3 and the fourth transistor M4, and damage is caused to other circuit structures coupled to the first internal transmission end USB_DP_1 and the second internal transmission end USB_DP_1, for example, the charging conversion chip 400 and the SoC 500.

To resolve the foregoing problem, as shown in FIG. 9a, the third switch circuit 103 is further coupled to the right-channel transmission end HSR and the left-channel transmission end HSL. In this case, the third switch circuit 103 further includes a third capacitor C3 and a fourth capacitor C4.

A first end of the third capacitor C3 is coupled to the right-channel transmission end HSR, and a second end of the third capacitor C3 is coupled to the gate G of the third transistor M3. In this case, the right-channel audio signal on the right-channel transmission end HSR is transmitted to the gate G of the third transistor M3 by using the third capacitor C3. In this case, when the right-channel audio signal transmitted to the first external transmission end USB_DP is applied to the second electrode (for example, the source S) of the third transistor M3, a voltage difference Vgs between the gate G and the second electrode (for example, the source S) of the third transistor M3 is 0, and the third transistor M3 is still in a cut-off state, to avoid forming a signal path between the first external transmission end USB_DP and the first internal transmission end USB_DP_1, so that a negative voltage in the right-channel audio signal is transmitted to a circuit structure coupled to the first internal transmission end USB_DP_1.

Similarly, a first end of the fourth capacitor C4 is coupled to the left-channel transmission end HSL, and a second end of the fourth capacitor C4 is coupled to the gate G of the fourth transistor M4. In this case, the left-channel audio signal on the left-channel transmission end HSL is transmitted to the gate G of the fourth transistor M4 by using the fourth capacitor C4. In this case, when the left-channel audio signal transmitted to the second external transmission end USB_DN is applied to the second electrode, for example, the source S, of the fourth transistor M4, a voltage difference Vgs between the gate G and the second electrode, for example, the source S, of the fourth transistor M4 is 0, and the fourth transistor M4 is still in a cut-off state, to avoid forming a signal path between the second external transmission end USB_DN and the second internal transmission end USB_DN_1, so that a negative voltage in the left-channel audio signal is transmitted to a circuit structure coupled to the second internal transmission end USB_DN_1.

In some other embodiments of this application, when a user performs charging independently, when a charger is connected to the mobile terminal, for example, a mobile phone, by using an external interface 200 (for example, a Type-C interface), a pin CC in the Type-C interface of the mobile phone identifies that an external device coupled to the Type-C interface is the charger.

In this case, the REGN end of the charging conversion chip 400 may serve as the second on voltage end VOUT2 to provide the second on voltage V2 to the gate of the third transistor M3 and the gate of the fourth transistor M4, to turn on the third transistor M3 and the fourth transistor M4. In this way, the charging conversion chip 400 may determine, by using voltages of the first internal transmission end USB_DP_1 and the second internal transmission end USB_DN_1, whether the charging type is fast charging or slow charging. Therefore, a voltage provided by the charger to the charging conversion chip 400 may be adjusted, so that the charging conversion chip 400 can perform fast charging or slow charging on the battery of the mobile terminal after converting the voltage provided by the charger.

In addition, because the analog headset is not coupled to the Type-C interface, the first on voltage end VOUT1 does not output the first on voltage V1. Therefore, the first transistor M1, the second transistor M2, and the isolation transistor M0 are all in a cut-off state.

In some other embodiments of this application, when the mobile phone is coupled to a data cable by using an external interface 200 (for example, a Type-C interface), the data cable may transmit external data to the first external transmission end USB_DP, and then the third transistor M3 transmits the external data to the SoC 500 by using the first internal transmission end USB_DP_1. The data cable coupled to the external interface 200 further transmits the external data to the second external transmission end USB_DN, and then the fourth transistor M4 transmits the external data to the SoC 500 by using the second internal transmission end USB_DN_1. Therefore, the SoC 500 can process the external data provided by the data cable.

Alternatively, the SoC 500 may further transmit, through the first internal transmission end USB_DP_1 by using the third transistor M3, the processed data to a data cable coupled to the first external transmission end USB_DP. In addition, the second internal transmission end USB_DN_1 is transmitted to a data cable coupled to the second external transmission end USB_DN by using the fourth transistor M4. Therefore, data in the mobile terminal can be transmitted to an external device coupled to the data cable.

It should be noted that the foregoing uses an example in which signal transmission between the first external transmission end USB_DP and the first internal transmission end USB_DP_1 is implemented by using the third transistor M3, and signal transmission between the second external transmission end USB_DN and the second internal transmission end USB_DN_1 is implemented by using the fourth transistor M4 for description. In some other embodiments of this application, when cabling space and product costs permit, an integrated switch including an NMOS transistor and a PMOS transistor may be used to replace the third transistor M3 and the fourth transistor M4.

Based on this, when a signal path is formed between the first external transmission end USB_DP and the first internal transmission end USB_DP_1, to prevent a parasitic capacitance in the first transistor M1 from affecting data transmitted on the signal path formed between the first external transmission end USB_DP and the first internal transmission end USB_DP_1, as shown in FIG. 9a, the third switch circuit 103 further includes a first magnetic bead (bead) L1.

A first end of the first magnetic bead L1 is coupled to the first switch circuit 101, namely, the first electrode, for example, the drain D, of the first transistor M1 in the first switch circuit 101. A second end of the first magnetic bead L1 is coupled to the second electrode, for example, the source S, of the third transistor M3.

Because a signal transmitted on the signal path formed between the first external transmission end USB_DP and the first internal transmission end USB_DP_1 is a high-frequency signal, and a frequency may reach a GHz level, the first magnetic bead L1 is in a high-resistance state, so that the drain D of the first transistor M1 may be isolated from the source S of the third transistor M3, to prevent the parasitic capacitance of the first transistor M1 from affecting the signal passing through the third transistor M3.

In addition, when the first transistor M1 is turned on and the third transistor M3 is cut off, because a signal passing through the first transistor M1 is a low-frequency signal and a frequency is at a kHz level, the first magnetic bead L1 is in a low-resistance state, so that the right-channel audio signal on the right-channel transmission end HSR can be transmitted to the first external transmission end USB_DP by using the first transistor M1 and the first magnetic bead L1.

In addition, to isolate the second electrode, for example, the source S, of the first transistor M1 from the gate of the third transistor M3, to further reduce impact of the parasitic capacitance of the first transistor M1 on the signal transmitted on the signal path formed between the first external transmission end USB_DP and the first internal transmission end USB_DP_1, the third switch circuit 103 may further include a third magnetic bead L3 shown in FIG. 9a. A first end of the third magnetic bead L3 is coupled to the first switch circuit 101, that is, the source S of the first transistor M1 in the first switch circuit 101, and a second end of the third magnetic bead L3 is coupled to the gate G of the third transistor M3.

Similarly, when a signal path is formed between the second external transmission end USB_DN and the second internal transmission end USB_DN_1, to prevent the parasitic capacitance in the second transistor M2 from affecting data transmitted on the signal path formed between the second external transmission end USB_DN and the second internal transmission end USB_DN_1, as shown in FIG. 9a, the third switch circuit 101 further includes a second magnetic bead L2.

A first end of the second magnetic bead L2 is coupled to the second switch circuit 102, namely, the first electrode, for example, the drain D, of the second transistor M2 in the second switch circuit 102, and a second end of the second magnetic bead L2 is coupled to the second electrode, for example, the source S, of the fourth transistor M4.

Similarly, it can be learned that when a signal path is formed between the second external transmission end USB_DN and the second internal transmission end USB_DN_1, the second magnetic bead L2 is in a high-resistance state, so that the drain D of the second transistor M2 may be isolated from the source S of the fourth transistor M4, to prevent the parasitic capacitance of the second transistor M2 from affecting a signal passing through the fourth transistor M4. In addition, when the second transistor M2 is turned on and the fourth transistor M4 is cut off, the right-channel audio signal on the right-channel transmission end HSR can be transmitted to the second external transmission end USB_DN by using the second transistor M2 and the second magnetic bead L2.

In addition, to isolate the second electrode, for example, the source S, of the second transistor M2 from the gate of the fourth transistor M4, to further reduce impact of the parasitic capacitance of the second transistor M2 on the signal transmitted on the signal path formed between the second external transmission end USB_DN and the second internal transmission end USB_DN_1, the third switch circuit 103 may further include a fourth magnetic bead L4 shown in FIG. 9a. A first end of the fourth magnetic bead L4 is coupled to the second switch circuit 102, namely, the second electrode (for example, the source S) of the second transistor M2 in the second switch circuit 102, and a second end of the fourth magnetic bead L4 is coupled to the gate G of the fourth transistor M4.

In conclusion, the first magnetic bead L1, the second magnetic bead L2, the third magnetic bead L3, and the fourth magnetic bead L4 form a daisy-chain arrangement manner, to reduce impact of the parasitic capacitances of the first transistor M1 and the second transistor M2 on data transmission on the signal path between the first external transmission end USB_DP and the first internal transmission end USB_DP_1, and on the signal path between the second external transmission end USB_DN and the second internal transmission end USB_DN_1, thereby improving eye pattern quality of a USB.

In some other embodiments of this application, when the analog headset is used during charging, a one-to-two adapter 201 shown in FIG. 4 may further be connected to the external interface 200 (for example, the Type-C interface). The one-to-two adapter 201 may be coupled to both the charger and the analog headset. Alternatively, when wireless charging is performed, the analog headset may be connected to the external interface 200 by using a common adapter. Therefore, the mobile terminal can be charged while the analog headset is used.

In this case, to transmit the audio signal in the mobile phone to the analog headset, the first on voltage end VOUT1 in FIG. 9a outputs the first on voltage V1. In this case, the first transistor M1 is turned on, and the right-channel transmission end HSR transmits the right-channel audio signal in the mobile phone to the first external transmission end USB_DP by using the first transistor M1. The left-channel transmission end HSL transmits the left-channel audio signal in the mobile phone to the second external transmission end USB_DN by using the second transistor M2.

In addition, because the mobile phone performs a charging operation, the REGN end of the charging conversion chip 400 can be used as the second on voltage end VOUT2 to output the second on voltage VOUT2. In this case, to avoid that the gate G of the third transistor M3 and the gate G of the fourth transistor M4 are in an on state after receiving the second on voltage VOUT2, the SoC 500 considers, according to the BC1.2 charging protocol, that the external device connected to the external interface 200 is a PC. Therefore, the phenomenon that the external device provides a very small charging current, for example, a 500 mA charging current, to the VBUS pin of the external interface 200 is controlled. When receiving the first on voltage V1 output by the first on voltage end VOUT1, the gate G of the isolation transistor M0 is in an on state.

In this case, the isolation transistor M0 may pull down the gate of the third transistor M3 and the gate of the fourth transistor M4 by using the ground end GND, so that the third transistor M3 and the fourth transistor M4 are in a cut-off state. Therefore, the first external transmission end USB_DP is disconnected from the first internal transmission end USB_DP_1, and the second external transmission end USB_DN is disconnected from the second internal transmission end USB_DN_1. In this way, the SoC 500 detects, according to the BC1.2 charging protocol, that the first internal transmission end USB_DP_1 and the second internal transmission end USB_DN_1 are in a floating state. In this case, the SoC 500 considers that a charger or a wireless charging device connected to the external interface 200 (for example, the Type-C interface) is a non-standard charger. In this way, the SoC 500 may control the external device to provide a charging voltage, for example, 5 V and a charging current, for example, 1.2 A (greater than 500 mA in a PC mode) in a non-standard charging mode to the VBUS pin of the external interface 200. Therefore, when the analog headset is used during charging, a charging speed of the mobile terminal is improved.

It can be learned from the foregoing that, in this application, that the isolation transistor M0 pulls down the third switch circuit 103 means that the isolation transistor M0 pulls down voltages of gates of the third transistor M3 and the fourth transistor M4 in the third switch circuit 103 by using the ground end GND, so that the voltages of the gates of the third transistor M3 and the fourth transistor M4 are reduced until the third transistor M3 and the fourth transistor M4 are in a cut-off state. In some embodiments of this application, the ground end GND may be coupled to a reference ground disposed on a PCB in the mobile terminal.

Figure 9B:
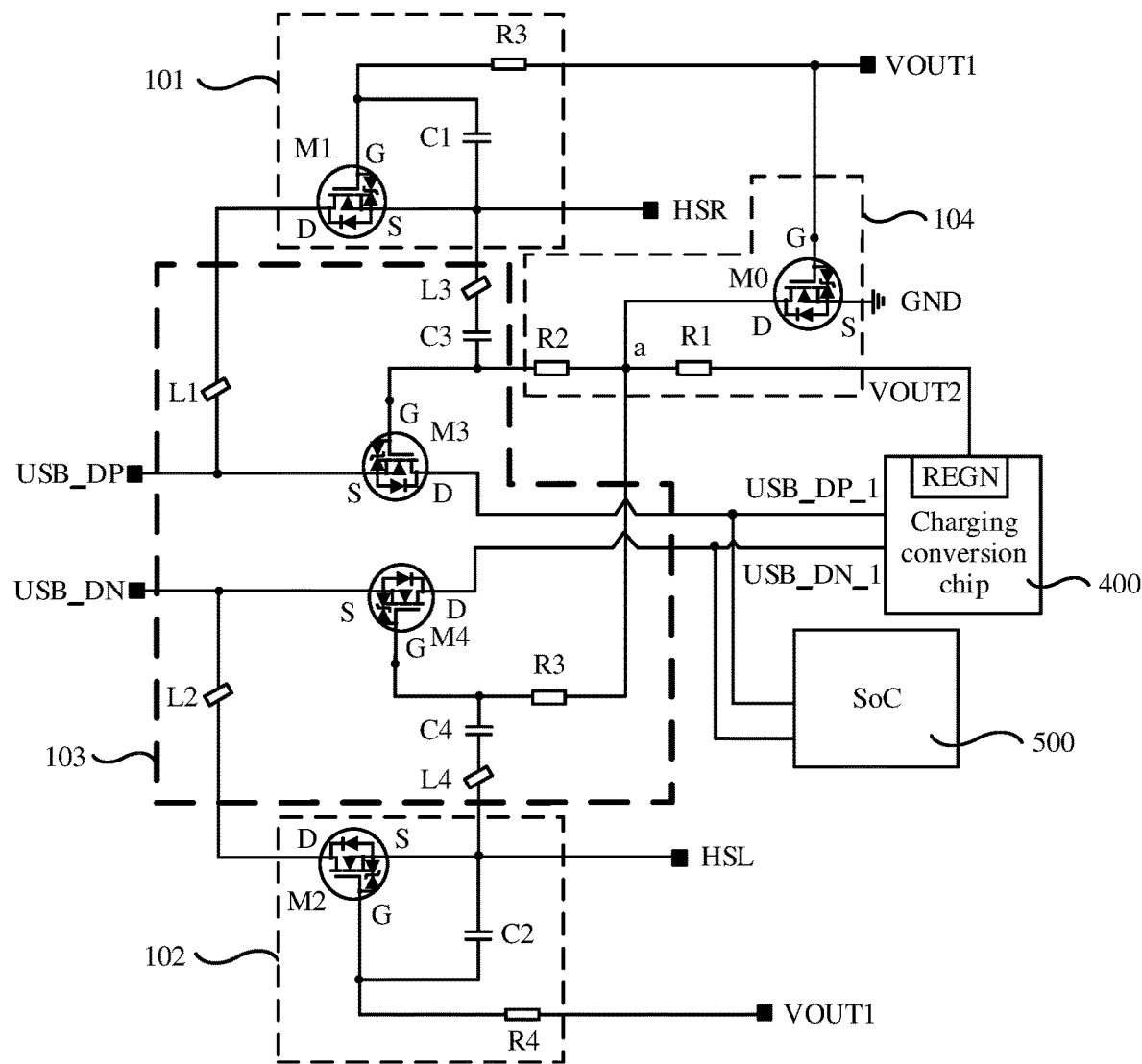
FIG. 9b is another specific schematic structural diagram of an interface circuit system according to some embodiments of this application.

Based on this, when the analog headset is used during charging, because the isolation transistor M0 is turned on, a voltage of node a in FIG. 9b is pulled down to a voltage of the ground end GND. In this case, node a may be isolated from the second voltage end VOUT2 by using the first resistor R1, so that it can be avoided that the ground end GND pulls down the REGN end (as the second voltage end VOUT2) of the charging conversion chip 400. Therefore, the charging conversion chip 400 can normally charge the battery of the mobile terminal.

In addition, when the isolation transistor M0 is turned on, because the first electrode (for example, the drain D) of the isolation transistor M0 is isolated from the gate G of the third transistor M3 by using the second resistor R2, it can be avoided that the isolation transistor M0 directly pulls the gate G of the third transistor M3 down to the voltage of the ground end GND, and that the voltage of the gate G of the third transistor M3 cannot change based on a change of the right-channel audio signal on the right-channel transmission end HSR.

Similarly, the first electrode (for example, the drain D) of the isolation transistor M0 is isolated from the gate G of the fourth transistor M4 by using the third resistor R3, it can be avoided that the isolation transistor M0 directly pulls the gate G of the fourth transistor M4 down to the voltage of the ground end GND, and that the voltage of the gate G of the fourth transistor M4 cannot change based on a change of the left-channel audio signal on the left-channel transmission end HSL.

In some embodiments of this application, a resistance of the first resistor R1 may range from 20 kΩ to 60 kΩ. When the resistance of the first resistor R1 is less than 20 kΩ, power consumption is affected, and an isolation effect of the first resistor R1 is not obvious. As a result, the ground end GND easily pulls down the REGN end of the charging conversion chip 400, and normal charging of the battery of the mobile terminal by the charging conversion chip 400 is affected.

In addition, the second on voltage V2 provided by the REGN end of the charging conversion chip 400 can be transmitted to the gate G of the third transistor M3 only after passing through the first resistor R1 and the second resistor R2, and transmitted to the gate G of the fourth transistor M4 only after passing through the first resistor R1 and the third resistor R3. Therefore, when the resistance of the first resistor R1 is greater than 60 kΩ, an impedance of the signal path is relatively large, and an on time of the transistor is affected. As a result, the transistor needs a relatively long time to be turned on, which may lead to a data communication failure.

In this way, when the resistance of the first resistor R1 may range from 20 kΩ to 60 kΩ, power consumption is not affected, a better isolation effect of the first resistor R1 can be ensured, and an on time of the transistor can be ensured. For example, the resistance of the first resistor R1 may be 20 kΩ, 25 kΩ, 30 kΩ, 35 kΩ, 40 kΩ, 45 kΩ, 50 kΩ, 55 kΩ, or 60 kΩ.

Similarly, resistances of the second resistor R2 and the third resistor R3 may range from 20 kΩ to 60 kΩ. In some embodiments of this application, resistances of the second resistor R2 and the third resistor R3 may be the same.

In conclusion, the mobile terminal having the interface circuit system provided in this embodiment of this application can be independently connected to an analog headset, and can be charged independently, or an analog headset can be used while the mobile terminal is charged in a non-standard charger mode.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A multiplexing circuit, comprising: a first switch circuit, a second switch circuit, a third switch circuit, and an isolation circuit, wherein the multiplexing circuit has a first external transmission end, a second external transmission end, a right-channel transmission end, a left-channel transmission end, a first internal transmission end, a second internal transmission end, a first on voltage end, a ground end, and a second on voltage end, wherein
    the first switch circuit is separately coupled to the first external transmission end, the right-channel transmission end, and the first on voltage end, and the first switch circuit is configured to: receive a first on voltage output by the first on voltage end, and transmit, to the first external transmission end, a right-channel audio signal provided by the right-channel transmission end;
    the second switch circuit is separately coupled to the second external transmission end, the left-channel transmission end, and the first on voltage end, and the second switch circuit is configured to receive the first on voltage, and transmit, to the second external transmission end, a left-channel audio signal provided by the left-channel transmission end;
    the isolation circuit is separately coupled to the third switch circuit, the first on voltage end, the ground end, and the second on voltage end, and the isolation circuit is configured to: when a second on voltage output by the second on voltage end is received, but the first on voltage output by the first on voltage end is not received, transmit the second on voltage to the third switch circuit; and the isolation circuit is further configured to: when the first on voltage and the second on voltage are received, pull down the third switch circuit, and isolate the ground end from the second on voltage end; and
    the third switch circuit is further separately coupled to the first external transmission end, the second external transmission end, the first internal transmission end, and the second internal transmission end, and the third switch circuit is configured to: when the second on voltage is received, couple the first external transmission end to the first internal transmission end, and couple the second external transmission end to the second internal transmission end; and the third switch circuit is further configured to: under the pull-down effect of the isolation circuit, disconnect the first external transmission end from the first internal transmission end, and disconnect the second external transmission end from the second internal transmission end.

2. The multiplexing circuit according to claim 1, wherein the isolation circuit comprises:
    an isolation transistor, wherein a gate of the isolation transistor is coupled to the first on voltage end, a first electrode of the isolation transistor is coupled to the third switch circuit, and a second electrode of the isolation transistor is coupled to the ground end; and
    a first resistor, wherein a first end of the first resistor is coupled to the first electrode of the isolation transistor, and a second end of the first resistor is coupled to the second on voltage end.

3. The multiplexing circuit according to claim 2, wherein the third switch circuit comprises:
    a third transistor, wherein a gate of the third transistor is coupled to the first electrode of the isolation transistor, a first electrode of the third transistor is coupled to the first internal transmission end, and a second electrode of the third transistor is coupled to the first external transmission end; and
    a fourth transistor, wherein a gate of the fourth transistor is coupled to the first electrode of the isolation transistor, a first electrode of the fourth transistor is coupled to the second internal transmission end, and a second electrode of the fourth transistor is coupled to the second external transmission end.

4. The multiplexing circuit according to claim 3, wherein the third switch circuit is further coupled to the right-channel transmission end and the left-channel transmission end; and the third switch circuit further comprises:
    a third capacitor, wherein a first end of the third capacitor is coupled to the right-channel transmission end, and a second end of the third capacitor is coupled to the gate of the third transistor; and
    a fourth capacitor, wherein a first end of the fourth capacitor is coupled to the left-channel transmission end, and a second end of the fourth capacitor is coupled to the gate of the fourth transistor.

5. The multiplexing circuit according to claim 4, wherein the isolation circuit further comprises:
a second resistor, wherein a first end of the second resistor is coupled to the gate of the third transistor, and a second end of the second resistor is coupled to the first electrode of the isolation transistor; and
a third resistor, wherein a first end of the third resistor is coupled to the gate of the fourth transistor, and a second end of the third resistor is coupled to the first electrode of the isolation transistor.

6. The multiplexing circuit according to claim 5, wherein a resistance of the first resistor ranges from 20 kΩ to 60 kΩ;
a resistance of the second resistor ranges from 20 kΩ to 60 kΩ; and
a resistance of the third resistor ranges from 20 kΩ to 60 kΩ.

7. The multiplexing circuit according to claim 3, wherein the third switch circuit further comprises:
a first magnetic bead, wherein a first end of the first magnetic bead is coupled to the first switch circuit, and a second end of the first magnetic bead is coupled to the second electrode of the third transistor; and
a second magnetic bead, wherein a first end of the second magnetic bead is coupled to the second switch circuit, and a second end of the second magnetic bead is coupled to the second electrode of the fourth transistor.

8. The multiplexing circuit according to claim 7, wherein the third switch circuit further comprises:
a third magnetic bead, wherein a first end of the third magnetic bead is coupled to the first switch circuit, and a second end of the third magnetic bead is coupled to the gate of the third transistor; and
a fourth magnetic bead, wherein a first end of the fourth magnetic bead is coupled to the second switch circuit, and a second end of the fourth magnetic bead is coupled to the gate of the fourth transistor.

9. The multiplexing circuit according to claim 2, wherein the first switch circuit comprises:
a first transistor, wherein a gate of the first transistor is coupled to the first on voltage end, a first electrode of the first transistor is coupled to the first external transmission end, and a second electrode of the first transistor is coupled to the right-channel transmission end; and
a first constant-voltage control circuit, coupled to the gate and the second electrode of the first transistor, wherein the first constant-voltage control circuit is configured to transmit the right-channel audio signal to the gate of the first transistor; and
the second switch circuit comprises:
a second transistor, wherein a gate of the second transistor is coupled to the first on voltage end, a first electrode of the second transistor is coupled to the second external transmission end, and a second electrode of the second transistor is coupled to the left-channel transmission end; and
a second constant-voltage control circuit, coupled to the gate and the second electrode of the second transistor, wherein the second constant-voltage control circuit is configured to transmit the left-channel audio signal to the gate of the second transistor.

10. The multiplexing circuit according to claim 9, wherein the first constant-voltage control circuit comprises a first capacitor, wherein a first end of the first capacitor is coupled to the gate of the first transistor, and a second end of the first capacitor is coupled to the second electrode of the first transistor; and
the second constant-voltage control circuit comprises a second capacitor, wherein a first end of the second capacitor is coupled to the gate of the second transistor, and a second end of the second capacitor is coupled to the second electrode of the second transistor.

11. The multiplexing circuit according to claim 9, wherein the first switch circuit further comprises a fourth resistor, wherein a first end of the fourth resistor is coupled to the gate of the first transistor, and a second end of the fourth resistor is coupled to the first on voltage end; and
the second switch circuit further comprises a fifth resistor, wherein a first end of the fifth resistor is coupled to the gate of the second transistor, and a second end of the fifth resistor is coupled to the first on voltage end.

12. An interface circuit system, comprising an external interface configured to be coupled to an external device, a charging conversion chip, an audio processing chip, and the multiplexing circuit according to claim 1, wherein the external interface is a Type-C interface, and the external interface comprises a pin D+, a pin D−, and a VBUS pin;
a first external transmission end of the multiplexing circuit is coupled to the pin D+, a second external transmission end of the multiplexing circuit is coupled to the pin D−, and a right-channel transmission end and a left-channel transmission end of the multiplexing circuit are separately coupled to the audio processing chip; and the audio processing chip is configured to: provide a right-channel audio signal to the right-channel transmission end, and provide a left-channel audio signal to the left-channel transmission end;
a second on voltage end of the multiplexing circuit is coupled to the VBUS pin; and
the charging conversion chip is separately coupled to the VBUS pin, and a first internal transmission end and a second internal transmission end of the multiplexing circuit; and the charging conversion chip is configured to adjust, based on voltages of the first internal transmission end and the second internal transmission end, a charging voltage provided by the VBUS pin;
wherein the interface circuit system further comprises a system on chip; the system on chip is separately coupled to the first internal transmission end and the second internal transmission end of the multiplexing circuit; and the system on chip is configured to identify, based on the voltages of the first internal transmission end and the second internal transmission end according to a charging protocol, the external device connected to the external interface.

13. The interface circuit system according to claim 12, wherein the interface circuit system further comprises a wireless charging circuit and a wireless isolation switch, wherein
the wireless charging circuit is coupled to the charging conversion chip, and the wireless charging circuit is configured to: receive a wireless charging signal, and provide a charging voltage to the charging conversion chip; and
the wireless isolation switch is coupled to the charging conversion chip and the VBUS pin, and the wireless isolation switch is configured to disconnect the charging conversion chip from the VBUS pin when the wireless charging circuit receives the wireless charging signal.

14. The interface circuit system according to claim 12, wherein the interface circuit system further comprises a low dropout regulator, wherein an input end of the low dropout regulator is configured to receive the charging voltage provided by the VBUS pin, and an output end of the low dropout regulator is coupled to the second on voltage end; and the low dropout regulator is configured to: perform voltage regulation on the charging voltage provided by the VBUS pin, and provide the charging voltage to the second on voltage end.

15. A mobile terminal, comprising a battery and the interface circuit system according to claim 12, wherein a first on voltage end of a multiplexing circuit in the interface circuit system is coupled to the battery; the battery is configured to provide a first on voltage to the first on voltage end; a charging conversion chip in the interface circuit system is coupled to the battery; and the charging conversion chip is configured to: convert a charging voltage provided by a VBUS pin of an external interface in the interface circuit system, and provide the charging voltage to the battery.

* * * * *